(12) United States Patent
Cheng et al.

(10) Patent No.: US 8,280,687 B2
(45) Date of Patent: Oct. 2, 2012

(54) DIRECT FAULT DIAGNOSTICS USING PER-PATTERN COMPACTOR SIGNATURES

(75) Inventors: Wu-Tung Cheng, Lake Oswego, OR (US); Manish Sharma, Wilsonville, OR (US); Thomas Hans Rinderknecht, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 755 days.

(21) Appl. No.: 11/584,038

(22) Filed: Oct. 20, 2006

(65) Prior Publication Data

US 2007/0100586 A1    May 3, 2007

Related U.S. Application Data

(63) Continuation-in-part of application No. 10/925,230, filed on Aug. 23, 2004, now Pat. No. 7,239,978.

(60) Provisional application No. 60/765,091, filed on Feb. 3, 2006, provisional application No. 60/776,282, filed on Feb. 24, 2006, provisional application No. 60/558,405, filed on Mar. 31, 2004.

(51) Int. Cl.
*G06F 11/30* (2006.01)
*G01R 31/28* (2006.01)

(52) U.S. Cl. ........................ 702/185; 714/729

(58) Field of Classification Search .................. 702/185, 702/189, 57, 81–82, 85, 107–109, 117, 182–183; 714/25, 30, 700, 729, 726–727, 732–739, 714/741–742, 799; 716/4; 703/1, 3–4, 13–15
See application file for complete search history.

(56) References Cited

U.S. PATENT DOCUMENTS

| | | | |
|---|---|---|---|
| 5,260,946 A | 11/1993 | Nunally | |
| 5,309,447 A | 5/1994 | Moskowitz et al. | |
| 5,345,450 A | 9/1994 | Saw | |
| 5,475,694 A | 12/1995 | Ivanov et al. | |
| 5,515,384 A | 5/1996 | Horton et al. | |
| 5,831,992 A | 11/1998 | Wu | |
| 5,930,270 A | 7/1999 | Forlenza et al. | |
| 5,991,898 A | 11/1999 | Rajski et al. | |
| 6,158,033 A | 12/2000 | Wagner et al. | |

(Continued)

FOREIGN PATENT DOCUMENTS

JP     03-089179     4/1991
(Continued)

OTHER PUBLICATIONS

Cheng et al., Compactor Independent Direct Diagnosis, Nov. 15-17, 2004, Proceedings of the 13th Asian Test Symposium.*

(Continued)

*Primary Examiner* — Toan M Le
(74) *Attorney, Agent, or Firm* — Klarquist Sparkman, LLP

(57) ABSTRACT

In embodiments of the disclosed technology, diagnosis of a circuit is performed using compactor signatures (a technique referred to herein as "signature-based diagnosis"). Signature-based diagnosis typically does not require a test step that bypasses the compactor. Compactor signatures can be read from a compactor on a per-pattern basis, and an expected signature can be loaded into a compactor while an actual signature is being read from the compactor. Error functions can be used to describe relationships between errors in scan cell values and per-pattern compactor signatures, and the functions can be used to help generate a list of fault candidates in a circuit design.

45 Claims, 21 Drawing Sheets

U.S. PATENT DOCUMENTS

| | | | |
|---|---|---|---|
| 6,199,184 B1 | 3/2001 | Sim | |
| 6,205,559 B1 | 3/2001 | Sakaguchi | |
| 6,256,759 B1 | 7/2001 | Bhawmik et al. | |
| 6,327,687 B1 | 12/2001 | Rajski et al. | |
| 6,363,506 B1 | 3/2002 | Karrie et al. | |
| 6,442,723 B1 | 8/2002 | Koprowski et al. | |
| 6,463,561 B1 | 10/2002 | Bhawmik et al. | |
| 6,516,432 B1 | 2/2003 | Motika et al. | |
| 6,543,020 B2 | 4/2003 | Rajski | |
| 6,557,129 B1 * | 4/2003 | Rajski et al. | 714/729 |
| 6,557,132 B2 | 4/2003 | Gangl et al. | |
| 6,662,327 B1 | 12/2003 | Rajski | |
| 6,671,839 B1 | 12/2003 | Cote et al. | |
| 6,684,358 B1 * | 1/2004 | Rajski et al. | 714/739 |
| 6,694,466 B1 | 2/2004 | Tsai et al. | |
| 6,728,901 B1 | 4/2004 | Rajski et al. | |
| 6,763,488 B2 | 7/2004 | Whetsel | |
| 6,829,740 B2 * | 12/2004 | Rajski et al. | 714/729 |
| 6,874,109 B1 * | 3/2005 | Rajski et al. | 714/726 |
| 6,883,115 B2 | 4/2005 | Sanada | |
| 6,954,888 B2 | 10/2005 | Rajski et al. | |
| 6,993,694 B1 | 1/2006 | Kapur et al. | |
| 6,996,791 B2 | 2/2006 | Brunkhorst et al. | |
| 7,007,213 B2 * | 2/2006 | Wang et al. | 714/729 |
| 7,032,148 B2 | 4/2006 | Wang et al. | |
| 7,058,869 B2 | 6/2006 | Abdel-Hafez et al. | |
| 7,093,175 B2 * | 8/2006 | Rajski et al. | 714/728 |
| 7,111,209 B2 * | 9/2006 | Rajski et al. | 714/718 |
| 7,185,253 B2 | 2/2007 | Mitra et al. | |
| 7,239,978 B2 | 7/2007 | Cheng et al. | |
| 7,296,249 B2 | 11/2007 | Rinderknecht et al. | |
| 7,302,624 B2 * | 11/2007 | Rajski et al. | 714/732 |
| 7,370,254 B2 * | 5/2008 | Rajski et al. | 714/726 |
| 7,437,640 B2 * | 10/2008 | Rajski et al. | 714/729 |
| 7,729,884 B2 | 6/2010 | Huang et al. | |
| 2003/0056163 A1 | 3/2003 | Rajsuman et al. | |
| 2003/0188269 A1 | 10/2003 | Mitra et al. | |
| 2004/0190331 A1 | 9/2004 | Ross et al. | |
| 2004/0230884 A1 | 11/2004 | Rajski et al. | |
| 2005/0055613 A1 | 3/2005 | Mitra et al. | |
| 2005/0081130 A1 | 4/2005 | Rinderknecht et al. | |
| 2005/0222816 A1 | 10/2005 | Cheng et al. | |
| 2006/0036985 A1 | 2/2006 | Mitra et al. | |
| 2006/0041813 A1 | 2/2006 | Rajski et al. | |
| 2006/0111873 A1 | 5/2006 | Huang et al. | |
| 2007/0038911 A1 | 2/2007 | Koenemann et al. | |
| 2007/0162803 A1 | 7/2007 | Dervisoglu et al. | |
| 2007/0283202 A1 | 12/2007 | Cheng et al. | |

FOREIGN PATENT DOCUMENTS

| | | |
|---|---|---|
| JP | 2003-084036 | 3/2003 |
| JP | 2004-012420 | 1/2004 |
| WO | WO2005/101222 A2 | 10/2005 |

OTHER PUBLICATIONS

Rajski et al., On the Diagnostic Properties of Linear Feedback Shift Registers, Oct. 1991, IEEE Transactions on Computer-Aided Design, vol. 10, No. 10, pp. 1316-1322.*

Mrugalski et al., Fault Diagnosis in Designs With Convolutional Compactors, 2004 IEEE, pp. 498-507.*

Leininger et al., Compression Mode Diagnosis Enables High Volume Monitoring Diagnosis Flow, Nov. 8, 2005, International Test Conference, pp. 1-10.*

Huang et al., Compressed Pattern Diagnosis for Scan Chain Failures, 2005 IEEE, pp. 1-8.*

Akers et al., "Why is less information from logic simulation more useful in fault simulation," *International Test Conference*, pp. 786-800 (1990).

Aldrich et al., "Improving Test Quality and Reducing Escapes," *Fabless Forum*, 2 pp. (2003).

Balachandran et al., "Correlation of Logic Failures to a Suspect Process Step," *International Test Conference*, pp. 458-466 (1999).

Bardell et al., *Built-In Test for VLSI: Pseudorandom Techniques*, John Wiley & Sons, Inc., Chapter 5, pp. 109-144 (1987).

Barnhart et al., "Extending OPMISR beyond 10× Scan Test Efficiency," *IEEE Design & Test of Computers*, pp. 65-73 (2002).

Bartenstein et al., "Diagnosing Combinational Logic Designs using the Single Location At-A-Time (SLAT) Paradigm," *International Test Conference*, pp. 287-296 (2001).

Bayraktaroglu and Orailoglu, "Test Volume and Application Time Reduction," *Design Automation Conference Proceedings*, pp. 151-155 (2001).

Benware et al., "Impact of Multiple-Detect Test Patterns on Product Quality," *International Test Conference*, pp. 1031-1040 (2003).

Bhattacharya et al., "Synthesis of Single-Output Space Compactors for Scan-Based Sequential Circuits," *IEEE Transactions on Computer-Aided Design of Integrated Circuits and Systems*, vol. 21, No. 10, pp. 1171-1179 (Oct. 2002).

Boppana et al., "Multiple Error Diagnosis Based on Xlists," *Design Automation Conference Proceedings*, 36th, pp. 660-665 (1999).

Chakrabarty et al., "Space Compaction of Test Responses Using Orthogonal Transmission Functions," *IEEE Transactions on Instrumentation and Measurement*, vol. 52, No. 5, pp. 1353-1362 (Oct. 2003).

Chan et al., "A Study of Faulty Signatures Using a Matrix Formulation," *International Test Conference*, pp. 553-561 (1990).

Cheng et al., "Diagnosis for Wiring Interconnects," *IEEE*, pp. 565-571 (1990).

Cheng et al., "Compactor Independent Direct Diagnosis," *IEEE Proceedings of the 13$^{th}$ Asian Test Symposium*, pp. 204-209 (Nov. 15-17, 2004).

Cheng et al., "Signature Based Diagnosis for Logic BIST," *International Test Conference*, paper 8.3, pp. 1-9 (2006).

Cox et al., "Method of Fault Analysis for Test Generation and Fault Diagnosis," *IEEE Transactions on Computer-Aided Design of Integrated Circuits and Systems*, vol. 7, No. 7 pp. 813-833 (1988).

Devgan et al., "Block-Based Static Timing Analysis with Uncertainty," *ICCAD*, pp. 607-614 (2003).

Eddleman et al., "Advanced Scan Diagnosis Based Fault Isolation and Defect Identification for Yield Learning," *International Symposium for Testing and Failure Analysis*, session 24 (2005).

Edirisooriya et al., "Diagnosis of Scan Path Failures," *Proceedings of VLSI Test Symposium*, pp. 250-255 (1995).

Ghosh-Dastidar et al., "A Rapid and Scalable Diagnosis Scheme for BIST Environments with a Large Number of Scan Chains," *Proceedings of the VLSI Test Symposium* (2000).

Ghosh-Dastidar et al., "Fault Diagnosis in Scan Based BIST Using Both Time and Space Information," *International Test Conference* (1999).

Guo et al., "A Technique for Fault Diagnosis of Defects in Scan Chains," *International Test Conference*, pp. 268-277 (2001).

Hamzaoglu and Patel, "Reducing Test Application Time for Full-Scan Embedded Cores", *Proceedings of Fault-Tolerant Computing*, pp. 15-18 (1999).

Huang et al., "Diagnosing DACS (Defects That Affect Scan Chain and System Logic)," *International Symposium on Testing and Failure Analysis*, pp. 191-196 (Nov. 2004).

Huang et al., "Efficient Diagnosis for Multiple Intermittent Scan Chain Hold-Time Faults," *Proceedings of Asian Test Symposium*, pp. 44-49 (Nov. 16-19, 2003).

Huang et al., "ErrorTracer: A Fault Simulation-Based Approach to Design Error Diagnosis," *International Test Conference*, pp. 974-981 (1997).

Huang et al., "Intermittent Scan Chain Fault Diagnosis Based on Signal Probability Analysis," *Proceedings of the Design, Automation and Test in Europe Conference and Exhibition*, pp. 1072-1077 (Feb. 16-20, 2004).

Huang et al., "Statistical Diagnosis for Intermittent Scan Chain Hold-Time Fault," *International Test Conference*, pp. 319-328 (Sep. 30-Oct. 2, 2003).

Huang et al., "Using Fault Model Relaxation to Diagnose Real Scan Chain Defects," *IEEE*, pp. 1176-1179 (Jan. 18-21, 2005).

Ivanov et al., "Programmable BIST Space Compactors," *IEEE Transactions on Computers*, vol. 45, No. 12, pp. 1393-1404 (1996).

Jas, et al., "Scan Vector Compression/Decompression Using Statistical Coding," *Proceedings of VLSI Test Symposium*, pp. 114-120 (1999).

Kapur et al., "Directed-Binary Search in Logic BIST Diagnostics," *Proceedings of the Design, Automation and Test in Europe Conference and Exhibition* (2002).
Keller et al., "Use of MISR Output Streams for Diagnostics," *International Test Conference*, pp. 735-743 (2005).
Koenemann et al., "Built in Logic Block Observation Techniques," *International Test Conference* (1979).
Krishna et al., "Test Vector Encoding Using Partial LFSR Reseeding," *International Test Conference*, pp. 885-893 (2001).
Kundu, "Diagnosing Scan Chain Faults," *IEEE Transactions on VLSI Systems*, vol. 2:4, pp. 512-516 (1994).
Leininger et al., "Compression-Mode Diagnosis enables High-Volume Monitoring Diagnosis Flow," *International Test Conference*, paper 7.3 (2005).
Li and McCluskey, "Diagnosis of Sequence Dependent Chips," *Proceedings of 20th VLSI Test Symposium*, pp. 187-192 (2002).
Lin et al., "High-Frequency, At-Speed Scan Testing," *IEEE Design and Test of Computers*, vol. 20, Issue 5, pp. 17-25 (2003).
McAnney et al., "There is Information in Faulty Signatures," *International Test Conference* (1987).
Mitra et al., "X-Compact an Efficient Response Compaction Technique for Test Cost Reduction," *International Test Conference*, pp. 311-320 (2002).
Narayanan et al., "An Efficient Scheme to Diagnose Scan Chains," *International Test Conference*, pp. 704-713 (1997).
Poehl et al., "Industrial Experience with Adoption of EDT for Low-Cost Test without Concessions," *International Test Conference*, pp. 1211-1220 (2003).
Pomeranz et al., "On Correction of Multiple Design Errors," *IEEE Transactions on CAD of Integrated Circuits and Systems*, vol. 14, No. 2, pp. 255-264 (1995).
Pouya et al., "Synthesis of Zero-Aliasing Elementary-Tree Space Compactors," *Proceedings of IEEE VLSI Test Symposium*, pp. 70-77 (1998).
Rajski et al., "Convolutional Compaction of Test Responses," *International Test Conference*, pp. 745-754 (2003).
Rajski et al., "Diagnosis of Scan Cells in BIST Environment," *IEEE Transactions on Computers*, vol. 48, No. 7, pp. 724-731 (Jul. 1999).
Rajski et al., "Embedded Deterministic Test for Low Cost Manufacturing Test," *International Test Conference*, pp. 301-310 (2002).
Rajski et al., "Test Data Decompression for Multiple Scan Designs with Boundary Scan," *IEEE Transactions on Computers*, vol. 47, No. 11, pp. 1188-1200 (Nov. 1998).
Rajsuman, Rochit, "Testing a System-On-a-Chip with Embedded Microprocessor," *International Test Conference*, pp. 499-508 (1999).
Richman et al., "The Modern Fault Dictionary," *International Test Conference*, pp. 696-702 (1985).
Savir et al., "Identification of Failing Tests with Cycling Registers," *International Test Conference*, pp. 322-328 (1988).
Savir, "Salvaging Test Windows in BIST Diagnostics," *IEEE Transactions on Computers*, vol. 47:4 (Apr. 1998).
Schafer et al., "Partner SRLs for Improved Shift Register Diagnostics," *Proceedings of VLSI Test Symposium*, pp. 198-201 (1992).
Stanley, "High-Accuracy Flush-and-Scan Software Diagnostic," *IEEE Design and Test of Computers*, pp. 56-62 (Nov.-Dec. 2001).
Stroud, "Automated BIST for Sequential Logic Synthesis," *IEEE Design and Test of Computers* (1988).
Takahashi et al., "Enhancing Multiple Fault Diagnosis in Combinational Circuits Based on Sensitized Paths and EB Testing," *The Fourth Asian Test Symposium*, pp. 58-64 (1995).
Tsuji et al., "Selecting Programmable Space Compactors for BIST Using Genetic Algorithm," *IEEE*, pp. 233-241 (1994).
Veneris et al., "A Fast Algorithm for Locating and Correcting Simple Design Errors in VLSI Digital Circuits," *Proceedings of Great Lake Symposium on VLSI Design*, pp. 45-50 (1997).
Venkataraman et al., "A Deductive Technique for Diagnosis of Bridging Faults," *Proceedings of IEEE ICCAD*, pp. 562-567 (1997).
Venketaraman and Drummonds, "Poirot: Applications of a Logic Fault Diagnosis Tool," *IEEE Design and Test of Computers*, vol. 18, No. 1 (Jan.-Feb. 2001).
Waicukauski and Lindbloom, "Failure Diagnosis of Structured VLSI," *IEEE Design and Test of Computers*, pp. 49-60 (Aug. 1989).

Wang et al., "An Efficient and Effective Methodology on the Multiple Fault Diagnosis," *International Test Conference*, pp. 329-338 (Sep. 30-Oct. 2, 2003).
Wang, "On Methods to Improve Test Generation Efficiency and Test Response Compaction," Ph.D. Thesis, University of Iowa, 138 pp. (2003).
Wohl et al., "Effective Diagnostics Through Interval Unloads in a BIST Environment," *Proceedings of the Design Automation Conference* (2002).
Wohl et al., "Xtolerant Compression and Application of Scan-ATPG Patterns in a BIST Architecture," *International Test Conference*, pp. 727-736 (Sep. 30-Oct. 2, 2003).
Wu et al., "Scan Based BIST Fault Diagnosis," *IEEE Transactions on Computer-Aided Design of Integrated Circuits and Systems*, vol. 18, No. 2 (Feb. 1999).
Wu, "Diagnosis of Scan Chain Failures," *Proceedings of International Symposium on Defect and Fault Tolerance in VLSI Systems*, pp. 217-222 (1998).
Zou et al, "On Methods to Improve Location Based Logic Diagnosis," *Proceedings of VLSI Design*, pp. 181-187 (Jan. 3-7, 2006).
Cox et al., "Method of Fault Analysis for Test Generation and Fault Diagnosis," *IEEE Trans. on CAD*, vol. 7, No. 7 pp. 813-833, 1988.
Huang, et al., "Compressed Pattern Diagnosis for Scan Chain Failures," *International Test Conference*, Paper 30.3, pp. 1-8, Nov. 8-10, 2005.
International Search Report and Written Opinion, issued in International Application No. PCT/US2005/09579 (corresponds to publication No. WO 2005/101222 A2, cited above), dated Apr. 21, 2006, 12 pp.
Notice of Allowance from the United States Patent and Trademark Office in parent U.S. Appl. No. 10/925,230, dated Feb. 26, 2007, 9 pp.
Office Action from the United States Patent and Trademark Office in co-pending U.S. Appl. No. 11/267,221, dated May 14, 2007, 16 pp.
Office Action from the United States Patent and Trademark Office in co-pending U.S. Appl. No. 11/267,221, dated Jan. 8, 2008, 18 pp.
Office Action from the United States Patent and Trademark Office in co-pending U.S. Appl. No. 11/267,221, dated Aug. 14, 2008, 11 pp.
Office Action from the United States Patent and Trademark Office in co-pending U.S. Appl. No. 11/267,221, dated Jan. 13, 2009, 15 pp.
Office Action from the United States Patent and Trademark Office in parent U.S. Appl. No. 10/925,230, dated Feb. 17, 2006, 17 pp.
Office Action from the United States Patent and Trademark Office in parent U.S. Appl. No. 10/925,230, dated Nov. 15, 2005, 5 pp.
Office Action from the United States Patent and Trademark Office in parent U.S. Appl. No. 10/925,230, dated Aug. 11, 2006, 5 pp.
Office Action from the United States Patent and Trademark Office in co-pending U.S. Appl. No. 11/772,648, dated Jul. 27, 2009, 19 pp.
Office Action from the United States Patent and Trademark Office in co-pending U.S. Appl. No. 11/267,221, dated Jul. 21, 2009, 19 pp.
Rajski et al., "Test Data Compression and Compaction for Embedded Test of Nanometer Technology Designs," *Proc. of the 21st International Conference on Computer Design*, 6 pp., Oct. 13-15, 2003.
Notice of Allowance, dated Jan. 12, 2010, in U.S. Appl. No. 11/267,221, 9 pp.
Office Action from the U.S. Patent and Trademark Office in co-pending U.S. Appl. No. 11/772,648, dated Jan. 13, 2010, 10 pp.
Lin et al., "SIFAR: Static Test Compaction for Synchronous Sequential Circuits Based on Single Fault Restoration," *IEEE*, 8 pp., 2000.
Office Action, dated Jun. 23, 2010, from the US Patent and Trademark Office, in co-pending U.S. Appl. No. 11/772,648, 10 pp.
Rajski et al., "Embedded Deterministic Test for Low-Cost Manufacturing," *IEEE Design & Test of Computers*, pp. 58-66, 2003.
Rajski et al., "Embedded Deterministic Test," *IEEE Transactions on Computer Aided Design*, vol. 23, No. 5, 17 pp., May 2004.
Final Office action dated Mar. 1, 2011, from U.S. Appl. No. 11/772,648, 11 pp.
Mitra et al., "X-Compact: An Efficient Response Compaction Technique," *IEEE Trans. on Computer-Aided Design of Integrated Circuits and Systems*, vol. 23, No. 3, pp. 421-432 (Mar. 2004).
Office action dated Jun. 8, 2011, from the U.S. Appl. No. 12/790,049, 8 pp.

\* cited by examiner

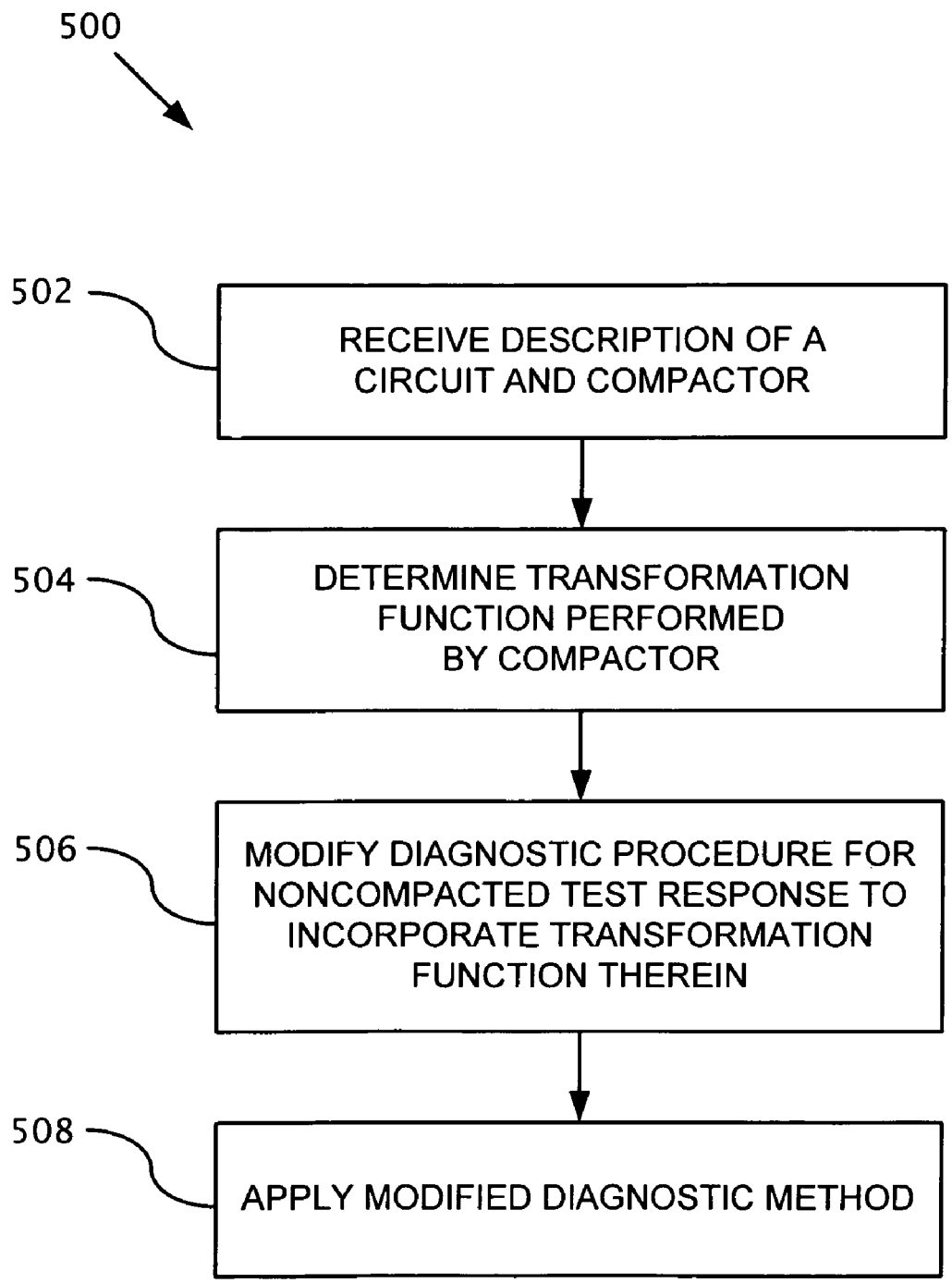

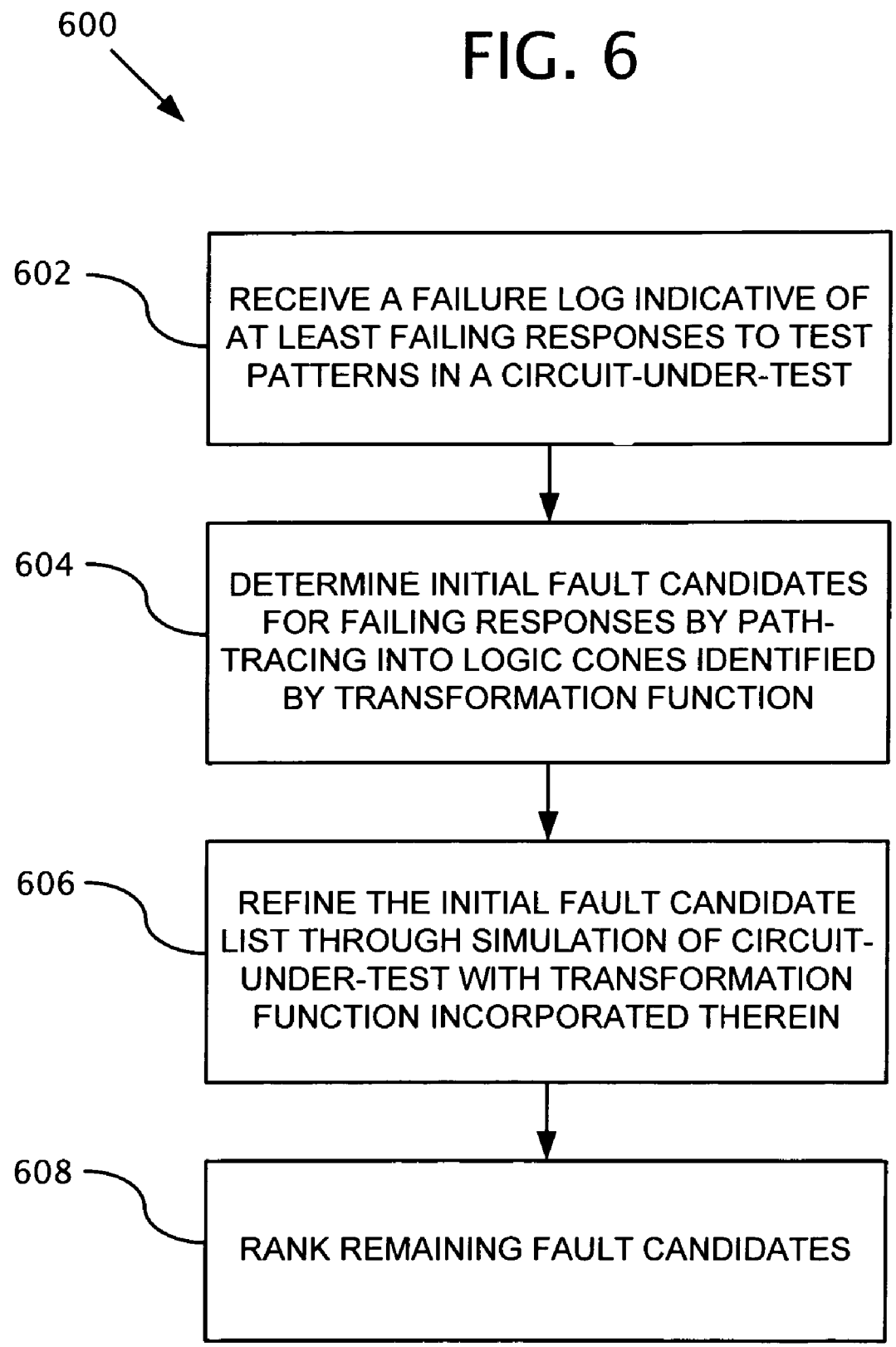

DIRECT FAULT DIAGNOSTICS USING PER-PATTERN COMPACTOR SIGNATURES

CROSS-REFERENCE TO RELATED APPLICATIONS

This application claims the benefit of U.S. Provisional Patent Application No. 60/765,091, filed Feb. 3, 2006, titled "DIRECT FAULT DIAGNOSTICS USING PER-PATTERN MISR SIGNATURES," and U.S. Provisional Patent Application No. 60/776,282, filed Feb. 24, 2006, titled "DIRECT FAULT DIAGNOSTICS USING PER-PATTERN MISR SIGNATURES," both of which are incorporated herein by reference. This application is a continuation-in-part of U.S. patent application Ser. No. 10/925,230, filed Aug. 23, 2004, titled "COMPACTOR INDEPENDENT FAULT DIAGNOSIS," now U.S. Pat. No. 7,239,978, which claims the benefit of U.S. Provisional Patent Application No. 60/558,405, filed Mar. 31, 2004, titled "COMPACTOR INDEPENDENT DIRECT DIAGNOSIS," both of which are incorporated herein by reference.

FIELD

The technologies disclosed herein relate to testing integrated circuits and relate in some embodiments, in part, to diagnosing defects in an integrated circuit.

BACKGROUND

The accurate diagnosis of faults is an increasingly important aspect of testing integrated circuits, especially in view of ever-increasing gate counts and shrinking feature sizes. For circuits that do not utilize compression techniques during testing, fault diagnosis can be relatively straightforward. For circuits that have embedded compression hardware, however, accurate fault diagnosis can present a challenge.

The use of compression during the testing of integrated circuits has become widespread. In general, compression helps reduce the volume of test data required for even traditional stuck-at test sets. Such test sets, for example, often exceed the capacity of automatic test equipment ("ATE") used to test integrated circuits. Moreover, due to the limited bandwidth between the circuit-under-test ("CUT") and the ATE, the use of compressed test data and compressed test responses can decrease test time, and thus the test cost.

Automated fault diagnosis (e.g., diagnosis based on scan patterns obtained from automated test pattern generation ("ATPG")) or from built-in self-test hardware, such as Logic built-in self-test ("BIST"), can be a component of an overall failure-analysis process. Automated fault diagnosis is generally used to predict the location of a failure in a CUT and has applications in such fields as silicon debugging, yield learning, and yield improvement. Given the failing test responses to a test set, an automated fault diagnosis tool desirably identifies the suspect fault sites that best explain the failures. The suspect sites identified can help locate the physical cause of the fault and can be used to guide failure analysis at the physical level.

Advances in scan diagnostics have led to diagnostics tools that are capable of identifying defect types, such as bridges or opens, as well as the potential defect location (also referred to as "fault location") on the die. These tools are typically used to post-process uncompressed fail information that is captured after applying ATPG vectors and stored in a tester. For ATPG vectors, the tester fail information can be directly mapped to failing scan cells. For Logic BIST, conventional wisdom indicates that a single MISR signature is sufficient to identify failing devices, but does not have enough information to identify the locations of detected defects. Thus, in order to do diagnosis, one can unload exact scan cell information in a diagnostic mode and perform the same diagnosis as with regular scan ATPG.

SUMMARY

Described below are exemplary methods, apparatus, and systems for testing integrated circuits. Some embodiments describe exemplary methods, apparatus, and systems for diagnosing faults on devices having embedded compression hardware. In some embodiments, faults are diagnosed from signatures produced by time compactors, such as infinite response ("IR") registers or multiple input signature registers ("MISRs"). The disclosed embodiments should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

In VLSI circuit manufacturing, scan-based testing and fault diagnosis can play an important role. For example, testing screens out chips with defects and diagnosing defects helps to determine the exact location, and probable cause of the failure. In the context of Logic BIST, the ability to diagnose failures directly from the Logic BIST patterns can be particularly desirable for several reasons. For instance, it is desirable to identify failures that occur when Logic BIST fails during system test. It is also useful to identify failures that occur when Logic BIST is used as part of the manufacturing test sequence. Because Logic BIST is based on the application of a large number of pseudo-random patterns, there is always some chance that a failure will be detected during the Logic BIST test that is not activated using conventional ATPG vectors. In this case, the ability to perform diagnostics directly from the Logic BIST pattern set can be useful in identifying the cause of the failure.

Some exemplary embodiments of the disclosed technology comprise methods for performing fault diagnosis (e.g., Logic BIST diagnosis) using compactor signatures (referred to herein as "signature-based diagnosis"). Conventional Logic BIST diagnosis approaches often require either huge data volume and run time or complicated BIST design and ATE flow. As shown in the experimental data discussed below, exemplary embodiments of the signature-based diagnosis can achieve similar diagnosis resolution with manageable diagnosis run time while eliminating some of the complexity associated with the traditional approach to Logic BIST diagnostics.

In one embodiment, a method of testing an electronic circuit comprises receiving a signature from a time compactor associated with the circuit design, determining a list of initial candidate fault locations using one or more error functions associated with the time compactor, the error functions being indicative of scan cells in the circuit that at least partially contribute to the value of one or more failing compactor bits in the signature, and storing the list of initial candidate fault locations on one or more computer-readable media. The method can further comprise performing one or more fault simulations to determine a revised list of fault locations from the list of initial candidate fault locations. In some embodiments, the error functions are used as part of the fault simulations. In further embodiments, the time compactor has inputs coupled to a space compactor. The error function can be determined by simulating errors from scan cells being unloaded into the time compactor. This simulation can comprise, for a selected scan chain, simulating an error from a later-unloaded scan cell as part of simulating an error from an earlier-unloaded scan cell. In some embodiments the signature can correspond to the circuit's response to a single test pattern. In some embodiments, the time compactor is a MISR. In further embodiments, the act of determining a list of initial candidate fault locations comprises applying a path tracing technique. The path tracing technique can comprise identifying candidate fault locations in the intersection between logic cones of scan cells identified by the error function. Other embodiments include a circuit having a repaired fault that was identified using one or more of the above methods. One or more computer-readable media can comprise computer-executable instructions for causing a computer to perform one or more of these methods. One or more computer-readable media can comprise a list of candidate fault locations produced according to one or more of these methods. Another embodiment comprises a system for testing an electronic circuit, the system comprising hardware configured to execute one or more of the above methods.

In other embodiments, a method comprises: determining one or more error signatures, the error signatures describing the effects of one or more error values captured in scan cells of an integrated circuit design on a compactor signature produced by a compactor coupled to the scan chains, the compactor signature comprising a plurality of compactor bits; producing an error function for a selected compactor bit from one or more of the determined error signatures, wherein the error function describes the effect of one or more scan cells on the value of the selected compactor bit; and storing the error function on one or more computer-readable media. In some embodiments, the act of determining the one or more error signatures comprises simulating an unloading of error values from the one or more scan cells into the compactor. The act of simulating can comprise storing an error value in a first scan cell and storing a non-error value in one or more remaining scan cells. In some embodiments, the error value is one and the non-error value is zero. In further embodiments, the act of simulating comprises simulating an unloading of a first value as part of simulating an unloading of a second value. In additional embodiments, the method further comprises receiving a failing signature generated from an implementation of the compactor, the failing signature including a failing value at the selected compactor bit, and determining a list of initial circuit defect candidate locations based at least in part on the error function. In some embodiments, the method further comprises performing one or more fault simulations according to the list of initial circuit defect candidate locations. The act of determining a list of initial circuit defect candidate locations can comprise using a path-tracing technique. The path-tracing technique can comprise identifying candidate fault locations within the intersection of logic cones for scan cells identified by the error function. In some embodiments the compactor is a MISR, and in other embodiments the compactor is an infinite response register. More generally, in some embodiments the compactor is a time compactor, which can be coupled to one or more scan chain outputs via a space compactor. In additional embodiments, one or more computer-readable media comprise computer-executable instructions for causing a computer to perform one or more of the above methods. Computer-readable media can also store an error function produced by one or more of the above methods.

In additional embodiments, a method of testing an electronic circuit comprises: using a time compactor to generate a signature from test results stored in a plurality of scan chains, the test results being generated after application of a test pattern; identifying scan cells that possibly captured error values using a description of an association between scan cells in the circuit and signature bits in the signature generated by the compactor; and storing a list of the scan cells identified. The method can further comprise performing path-tracing into logic cones associated with the scan cells identified to determine initial candidate fault locations and storing a list of the initial candidate fault locations. In some embodiments, the list of initial candidate fault location consists of fault locations in the intersection of the logic cones. The description can be determined by simulating errors from scan cells being unloaded into the time compactor. In some embodiments this simulation includes, for a selected scan chain, simulating an error from a later-unloaded scan cell as part of simulating an error from an earlier-unloaded scan cell.

Any of the disclosed methods can be implemented as computer-readable media comprising computer-executable instructions for causing a computer to perform the method. Further, computer-readable media comprising lists of fault candidates identified by any of the disclosed methods or circuit descriptions created or modified by the disclosed methods are also disclosed. Circuits having faults that were repaired by any of the disclosed methods are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 5 is a flow chart of a first embodiment of a general fault diagnostic procedure for diagnosing faults from compacted test responses. In the embodiment illustrated in FIG. 5, a modified diagnostic procedure is used.

FIG. 6 is a flow chart of an exemplary embodiment of a modified diagnostic procedure as may be utilized by the exemplary procedure shown in FIG. 5. Specifically, FIG. 6 shows a modified version of the effect-cause diagnostic procedure from FIG. 1.

DETAILED DESCRIPTION

Figure 1:
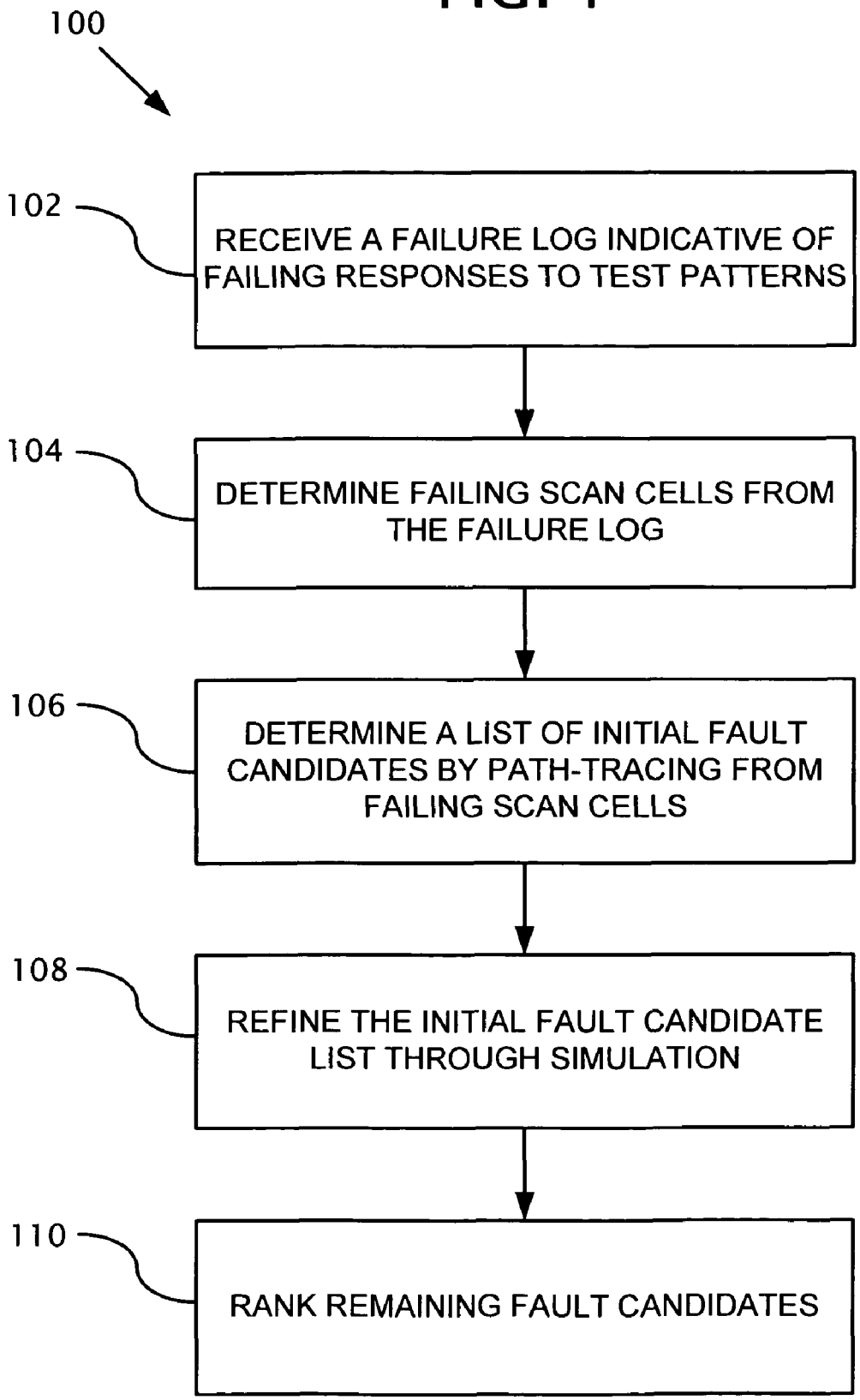
FIG. 1 is a flow chart of an exemplary embodiment of an effect-cause diagnostic procedure.

Disclosed below are representative embodiments of methods, apparatus, and systems for performing fault diagnosis that should not be construed as limiting in any way. Instead, the present disclosure is directed toward all novel and non-obvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

Moreover, any of the methods, apparatus, and systems described herein can be used in conjunction with a wide variety of scan-based or partially-scan-based circuits and can incorporate a wide variety of diagnostic procedures (e.g., effect-cause-based procedures utilizing structural pruning techniques and/or backward path-tracing techniques, which may be modified by various measures). Further, the fault candidates identified need not be of a particular type, but can vary from implementation to implementation (e.g., stuck-at faults, transition faults, bridging faults, and other faults). For illustrative purposes only, however, many of the examples described herein are explained in the context of utilizing an embodiment of an effect-cause algorithm used to diagnose stuck-at faults.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software may comprise, for example, electronic design automation ("EDA") software (e.g., an automatic test pattern generation ("ATPG") tool) used to diagnose test results captured during production testing of one or more circuits (e.g., an application specific integrated circuit ("ASIC"), a programmable logic device ("PLD") such as a field-programmable gate array ("FPGA"), or a system-on-a-chip ("SoC") having digital, analog, or mixed-signal components thereon). This particular software implementation should not be construed as limiting in any way, however, as the principles disclosed herein are generally applicable to other software tools. Circuit faults that are detected using the disclosed techniques may in some circumstances be repaired.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. For example, the disclosed embodiments can be implemented using a wide variety of commercially available computer systems and/or testing systems. Any of the disclosed methods can alternatively be implemented (partially or completely) in hardware (e.g., an ASIC, PLD, or SoC).

Further, diagnostic results (including any intermediate diagnostic results) produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. For example, a list comprising suspect scan cells (also referred to as "faulty scan cell candidates") or fault location candidates produced by the application of any of the disclosed embodiments may be stored on computer readable-media. Such diagnostic results can be created or updated at a local computer or over a network (e.g., by a server computer). As used herein, the term "list" refers to a collection or arrangement of data that is usable by a computer system. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database).

The one or more integrated circuits being tested may additionally comprise specialized hardware components used to implement the testing (e.g., BIST hardware for generating test patterns and signatures). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Moreover, any of the disclosed methods can be used in a computer simulation, ATPG, or other EDA environment, wherein test patterns, test responses, and compressed test responses are determined by or otherwise analyzed using representations of circuits, which are stored on one or more computer-readable media. For presentation purposes, however, the present disclosure sometimes refers to a circuit or its circuit components by their physical counterpart (for example, scan cells, MISRs, primary outputs, paths, circuits, and other such terms). It should be understood, however, that any reference in the disclosure or the claims to a physical component includes representations of such circuit components as are used in simulation, ATPG, or other such EDA environments.

General Considerations

Compression techniques are often used in connection with the testing of integrated circuits. Such techniques are typically implemented by inserting some hardware block (which is termed generally a "compactor" for purposes of this disclosure) along the scan path on the output side of a scan-based or partially-scan-based circuit-under-test. The compactor block compresses the data captured in the internal scan chains of the circuit-under-test, thereby producing a data stream of compacted test responses that is output on a few scan-output channels for comparison with expected values (e.g., by automated test equipment ("ATE")).

In general, compactors can be divided into three categories: (1) space compactors; (2) infinite input response compactors; (3) and finite input response compactors. Space compactors comprise combinational circuits that generate c test outputs from C outputs of the circuit-under-test ("CUT"), where c<C. Space compactors can ordinarily handle unknown states in test responses without any functional logic modification. Examples of space compactors include the so-called "EDT compactor" described in Rajski J., et al., "Embedded Deterministic Test for Low-Cost Manufacturing," *Proc. ITC* 2002, pp. 301-310 (2002), and the so-called "X-compactor" described in Mitra S., et al., "X-Compact: An Efficient Response Compaction Technique for Test Cost Reduction," *Proc. ITC* 2002, pp. 311-320 (2002). A second class of compactors—infinite-input-response compactors (also referred to as "time compactors")—utilize polynomial division, counting-based techniques, and check-sum-based methods. Such compactors are typically used in BIST applications. Examples of such compactors are described in Bardell P. et al., "Built-in Self-Test for VLSI: Pseudorandom Techniques," John Wiley & Sons (1987). A third class of compactors can be generally classified as finite-input-response compactors, which are characterized as having memory but no feedback. Consequently, any error or unknown state that is injected into the compactor is shifted out after some number of cycles. An example of a finite-input-response compactor is the so-called "convolutional compactor" described in Rajski, J., et al., "Convolutional Compaction of Test Reponses," *Proc. ITC* 2003, pp. 745-754 (2003).

Diagnostic procedures used to analyze circuit responses to test patterns can also be classified into different categories. Two major categories of diagnostic procedures are: (1) cause-effect methods (that is, methods based on cause-effect principles); and (2) effect-cause methods (that is, methods based on effect-cause dependencies). Cause-effect methods typically build a simulation-response database for modeled faults and compare observed failing responses to the database in order to determine the probable cause of the failure. This type of method is often referred to as the "fault dictionary" method, as it requires a large fault-behavior database to be created, stored, and maintained. This method can provide good resolution for assumed fault models whose defect behavior is similar to the modeled fault behavior. For large designs, however, this approach can be impractical due to memory constraints in the tester.

Effect-cause methods generally involve analyzing the actual circuit response to a test pattern in order to determine which fault(s) might have caused the observed failure. The analysis can be performed, for example, by backward path tracing from the scan cells and/or primary outputs of the circuit-under-test where faulty behaviors are observed. The error-propagation paths for possible fault suspects can then be identified. Compared to methods based on cause-effect principles, methods based on effect-cause dependencies are generally more memory-efficient and are better able to handle larger designs.

FIG. 1 is a flow chart illustrating an exemplary effect-cause procedure 100 as may be used to analyze test responses to a circuit-under-test having no compaction hardware. The exemplary effect-cause method 100 may be utilized as the underlying diagnostic procedure for the methods described below, which are capable of diagnosing faults in compactor-based designs without being limited to any particular compactor.

At method act 102 of FIG. 1, information indicative of a circuit-under-test's response to one or more test patterns is received. Typically, this information comprises test responses that are captured in scan cells of the circuit-under-test ("CUT") and that are clocked out through scan-out pins. The information received may be a complete record of a test session (e.g., a record of all responses to one or more test patterns) or some portion thereof (e.g., a record of just the failing responses to one or more test patterns). Such information is typically stored in a failure log (or fail log) on the tester, which may then be transferred to another system for diagnosis or may be diagnosed directly by the tester. From the information received, the scan cells within the CUT that captured the failing responses can be determined. For purposes of this discussion, these scan cells are termed "failing scan cells."

At method act 104, one or more failing scan cells are identified from the failing responses listed in the failure log. For a circuit design having no compactor, the failing responses in the failure log can be directly correlated with failing scan cells.

At method act 106, an initial list of fault candidates is identified. The fault candidates comprise the physical locations in the CUT that might contain a physical defect that caused the failing response to appear downstream. To identify the fault candidates, a path-tracing technique can be used. For example, the path-tracing algorithm described in Venkataraman S., et al., "A Deductive Technique for Diagnosis of Bridging Faults," *Proc. IEEE ICCAD*, pp. 562-67 (1974) can be used. This particular path-tracing algorithm, however, is not limiting, as there exist many path-tracing algorithms that are suitable for use in the method 100. The path-tracing technique analyzes a representation of the CUT (e.g., a netlist or HDL file) and identifies the instances of logic (and possibly other circuit components) that at least partially contribute to the test response captured in each failing scan cell. For purposes of this disclosure, the components of the CUT that contribute to the value captured at a respective scan cell are referred to as that scan cell's "logic cone," which has a so-called "fan-in region" that leads to the scan cell.

Figure 2:
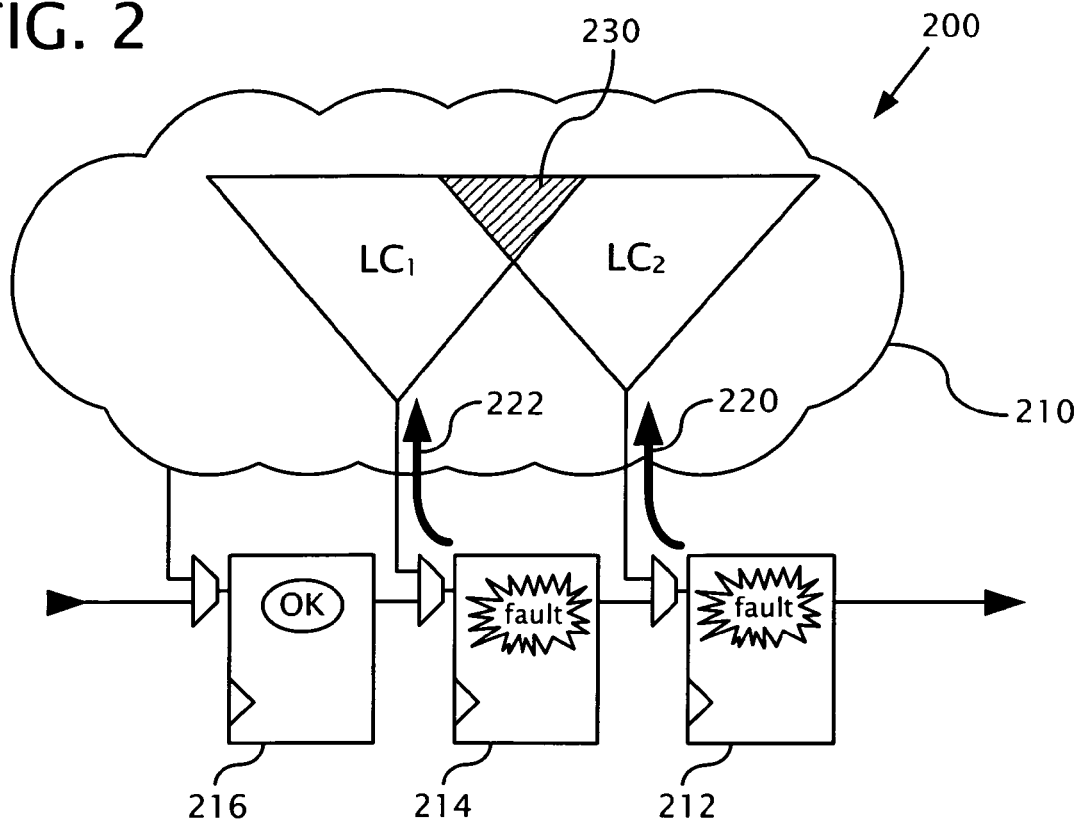
FIG. 2 is a block diagram illustrating an embodiment of the act of path-tracing into logic cones associated with failing scan cells such as in method act 106 of FIG. 1.

FIG. 2 is a schematic block diagram 200 illustrating an exemplary method act 106 of FIG. 1. In FIG. 2, circuit logic 210 of a CUT receives test-pattern values during a launch phase of testing, thereby producing test responses at three respective scan cells 212, 214, 216. For illustrative purposes only, assume that scan cells 214 and 212 capture failing test response (sometimes referred to herein as "failure responses" or "observed failure responses") after application of an exemplary test pattern.

At method act 106, logic cones $LC_1$ and $LC_2$ are identified from the failing scan cells 212, 214 using the path-tracing technique (represented by arrows 220, 222). In certain embodiments of the method 100, only fault candidates in the intersection 230 are included in the list of initial fault candidates, as it is assumed in such embodiments that both of the failing test responses were caused by a single fault in the CUT. Therefore, having identified the logic cones $LC_1$ and $LC_2$, an intersection 230 between the logic cones can be determined. In some implementations of the diagnostic procedure, an additional determination is made (e.g., during path tracing) as to whether sensitization paths exist from the fault candidates to all of the faulty scan cells for the failing pattern. If not, then the fault candidates are removed from the list. The remaining fault candidates form the initial fault candidate list.

At method act 108, the initial fault candidate list is refined through simulation. For example, according to one exemplary implementation, simulations of the circuit-under-test are performed wherein each fault from the initial list of candidate faults is injected into the simulator's representation of the circuit and application of one, some, or all of the failing test patterns is simulated. From these simulations, a determination can be made as to which fault candidates match the actual response recorded in the failure log. The matching fault candidates are those that propagate the observed faulty effect to the failing scan cells (and/or the observed failing primary outputs), but not to any other observation point (e.g., other scan cells or primary outputs) upon application of the corresponding test pattern. In certain embodiments, the speed of the simulation may be increased using, for example, parallel-pattern single-fault propagation techniques ("PPSFP"), which allow for multiple failing patterns (e.g., 32 patterns) to be processed in parallel.

In some embodiments, certain weighted criteria may be used during method act 108. For example, according to one particular implementation, a first weighted value $w_f$ can be used to indicate the number of failing patterns a fault candidate can explain. The value of $w_f$ (which initially can be zero) can be increased by one for each failing test pattern the corresponding fault explains. In certain embodiments, fault candidates having a value of $w_f$ that is still equal to zero after simulation are removed from the list of fault candidates.

Figure 3:
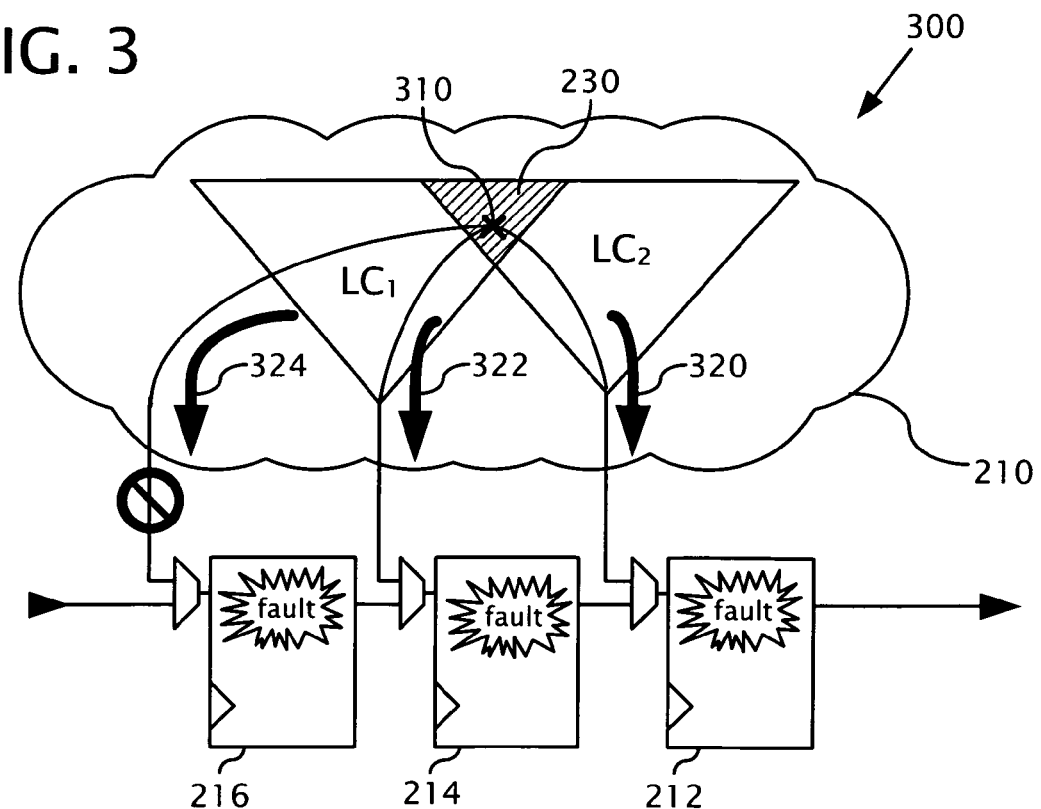
FIG. 3 is a block diagram illustrating an embodiment of the act of simulating faults in a representation of the circuit in order to refine a list of initial fault candidates, such as in method act 108 of FIG. 1.

FIG. 3 is a schematic block diagram 300 illustrating the forward simulation of fault candidates that occurs at method act 108. In particular, FIG. 3 illustrates the forward simulation (denoted by arrows 320, 322, 324) of the circuit logic 210 when a failing test pattern is applied in the presence of a selected fault 310 from the initial list of fault candidates. In the illustrated example, the selected fault 310 produces an unexpected response at scan cell 216, as well as the expected responses at scan cells 212, 214. Accordingly, in this example, the selected fault 310 does not explain the observed test response, and, in certain embodiments, the first weighted value $w_f$ will not be increased. In some embodiments, if the simulated test pattern is the test pattern that produced the test response used to identify the fault candidate, then the fault candidate is removed from the list of candidates unless it produces a simulated test response identical to the actual test response.

At method act 110, the remaining fault candidates are ranked. In some embodiments of the method 100, for example, additional simulations are performed to help further refine the list of candidate faults. For instance, one or more passing test patterns can be simulated in the presence of each of the fault candidates in order to calculate a second weighted value $w_g$. In one particular implementation, the value of $w_g$ is increased by one for each successful test pattern that the fault candidate explains. The first weighted value $w_f$ and the second weighted value $w_g$ may then be used to rank the remaining candidates. For example, a combined weight utilizing both $w_f$ and $w_g$ may be calculated using the following equation:

$$(\alpha w_f + (1-\alpha) w_g) \quad (1)$$

where $\alpha$ is a real number between "0" and "1." Using the list of ranked candidates, physical inspections of the circuit-under-test can be performed, and, in many instances, the fault repaired.

Compactor Modeling Generally

One of the techniques that may be utilized in embodiments of the disclosed technology is compactor modeling. A typical scan-based or partially-scan-based design-for-test ("DFT") circuit uses a plurality of scan chains that feed into the compactor. For each test pattern launched in the circuit-under-test, test responses of "1," "0," or "X" (unknown bits) are captured into scan cells of the scan chain and shifted into the compactor. Each bit of the test response after compaction (denoted generally as $P_i$, where i is an index value that increases incrementally for each value output from the compactor) can be expressed as a function of a set of values that are captured into the scan cells before compaction. For any given compactor, there exists a unique set of equations that represents the relationships between the values observed after compaction and the values captured into the scan cells before compaction. As used herein, this relationship is defined by the "transformation function" and is denoted as $\Phi_i$ such that $P_i = \Phi_i(C_i)$ where $C_i$ is the corresponding set of logic cones that determine the test responses captured in scan cells before compaction. The cumulative set of transformation functions $\Phi_i$, representative of all values output from the compactor, can be denoted by the general transformation operator $\Phi$. This particular form of notation should not be construed as limiting, however, as the transformation function can be described or denoted in a variety of different ways. For example, the transformation function of a particular compactor can be described as a set of matrices denoting the test responses before and after compaction. The exact values of $\Phi_i$ may be determined by the compactor architecture present in the circuit design and will vary from design to design. Further, in some compactor architectures (e.g., infinite input response compactors), the transformation function will vary over time (e.g., each time the compactor is clocked).

Figure 4A:
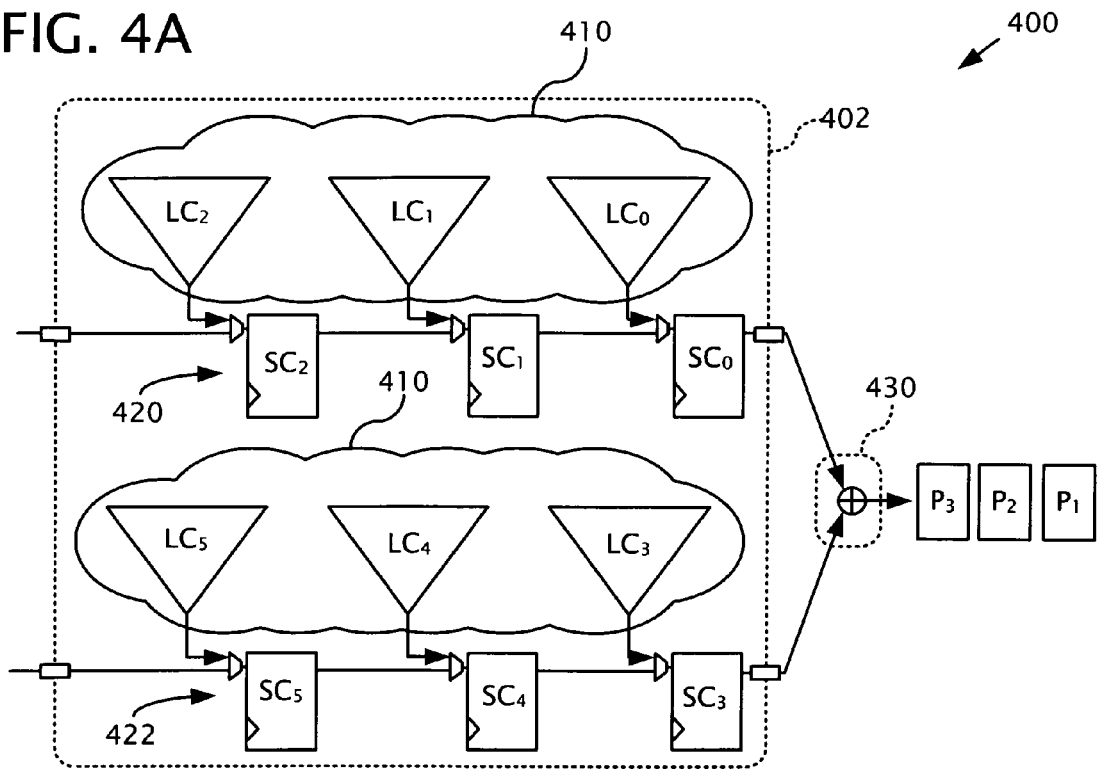
FIG. 4A is a block diagram of an exemplary scan-based circuit-under-test configured to capture test responses in scan cells and output the test responses to a compactor.
Figure 4B:
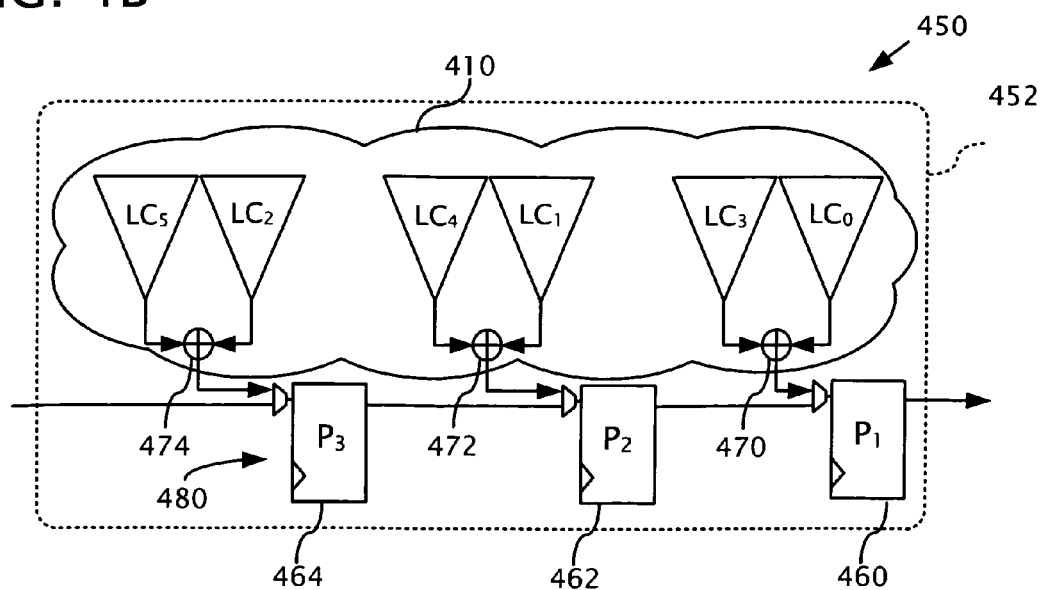
FIG. 4B is a block diagram illustrating an example of how the circuit-under test from FIG. 4A can be transformed such that the transformation function performed by the compactor is performed upstream of the original scan cells.

FIGS. 4A and 4B are block diagrams 400 and 450, respectively, that illustrate conceptually how the transformation function Φ can be applied to a circuit-under-test 402. The circuit-under-test 402 comprises logic 410 wherein six logic cones ($LC_0$ through $LC_5$) feed six exemplary scan cells ($SC_0$ through $SC_5$). Scan cells $SC_0$ through $SC_2$ form a first scan chain 420, whereas scan cells $SC_3$ through $SC_5$ form a second scan chain 422. In this example, the first and second scan chains 420, 422 output into a compactor 430, which, for illustrative purposes only, is assumed to be an XOR gate (as may be used, for example, in a space compactor, such as the EDT compactor). The compacted test responses ($P_1$ through $P_3$) are output from the compactor 430 (e.g., through a scan-out pin). Thus, in FIGS. 4A and 4B, the transformation function Φ corresponds to the XOR function, which is universally applied in this specific example during every clock cycle of the illustrated compactor 430. Thus, for compacted test responses $P_1$ through $P_3$, the compactor can be modeled as follows:

$$P_1 = (0 \oplus 3),$$

$$P_2 = (1 \oplus 4), \text{ and}$$

$$P_3 = (2 \oplus 5), \tag{2}$$

where $\oplus$ corresponds to the XOR function, and the numerals represent the test responses produced by the corresponding logic cones (e.g., "0" represents the response produced by logic cone $LC_0$).

The transformation function can also represent a more general relationship between compacted test responses and the respective logic cones that at least partially contribute to them (that is, the representation does not need to specifically model the Boolean function performed by the compactor). In this example, for instance, the transformation function can be described as follows:

$$P_1 = \Phi_0(\{0,3\}),$$

$$P_2 = \Phi_1(\{1,4\}), \text{ and}$$

$$P_3 = \Phi_2(\{2,5\}), \tag{3}$$

where the numerals represent the logic cones that produce the test responses compacted via the function $\Phi_i$ (e.g., "0" represents logic cone 0 and the test response it produces).

A representation of the circuit-under-test 402 can be modified so that the transformation function Φ is embedded in the transformed circuit. The resulting modified circuit can be viewed as one having no compactor, and having "pseudo-scan-chains" and "pseudo-scan-cells" instead of scan chains and scan cells. An exemplary modified circuit representation 452 is shown in FIG. 4B. The modified circuit representation 452 is logically identical to the circuit-under-test 402 with the compactor 430, but the original internal scan chains 420 and 422 are replaced by one pseudo-scan-chain 480 and the original internal scan cells $SC_0$ through $SC_5$ are replaced by three pseudo-scan-cells 460, 462, 464. In addition, the transformation function Φ performed by the compactor 430 is moved upstream of the pseudo-scan-cells 460, 462, 464. In the illustrated example, for instance, three XOR gates 470, 472, 474 are inserted into the circuit-under-test 410 and output into three pseudo-scan-cells 460, 462, 464, which capture the values $P_1$ through $P_3$.

Exemplary Embodiments for Diagnosing Faults from Compacted Test Responses

There are multiple ways in which the transformation function Φ or a transformed circuit can be utilized as part of an overall diagnostic procedure for scan-based or partially-scan-based designs having compacted test results. Two exemplary techniques are shown generally in FIGS. 5 and 6, respectively.

Modifying the Diagnostic Procedure

FIG. 5 is a flow chart illustrating a first general embodiment for performing fault diagnosis on compacted test results in which the diagnostic procedure itself is modified. The method 500 shown in FIG. 5 can be applied to a wide variety of different compaction schemes and can utilize a variety of existing diagnostic algorithms. Further, embodiments of the method 500 can perform on-line diagnosis and/or account for multiple errors captured in a test response and output during a single scan-out cycle.

At method act 502, a description of a scan-based or partially-scan-based circuit and a compactor is received. The description may be a circuit design file as is commonly used in the EDA industry (e.g., the description may be a netlist or a hardware description language ("HDL") file, such as a VHSIC Hardware Description Language ("VHDL") file or Verilog file).

At method act 504, at least a portion of the transformation function Φ performed by the compactor in the circuit description is determined. This determination can be made mathematically or empirically using, for example, a logic simulation of the circuit and compactor.

At method act 506, a diagnostic procedure for diagnosing uncompacted test responses is modified such that the transformation function is incorporated into the procedure. As a result of determining the transformation function at method act 504 (e.g., the transformation function $\Phi_i$ for at least a portion of the compacted test responses), a relationship between a compacted test response $P_i$ and the logic cones that may have contributed to the test responses (the "candidate logic cones") is known. The diagnostic procedure can be modified to account for this relationship, such that the additional acts performed in the procedure assume that all of the candidate logic cones related to a failing test response $P_i$ via the transformation function are to be analyzed. An example of this process is described in greater detail below with reference to FIG. 6.

At method act 508, the modified diagnostic procedure is applied to compacted test responses. For instance, the modified diagnostic procedure can be applied to the failures recorded in a failure log from a tester after applying test patterns to a circuit-under-test and having the test responses compacted by a compactor.

Exemplary Embodiments of a Modified Diagnostic Procedure

Figure 7A:
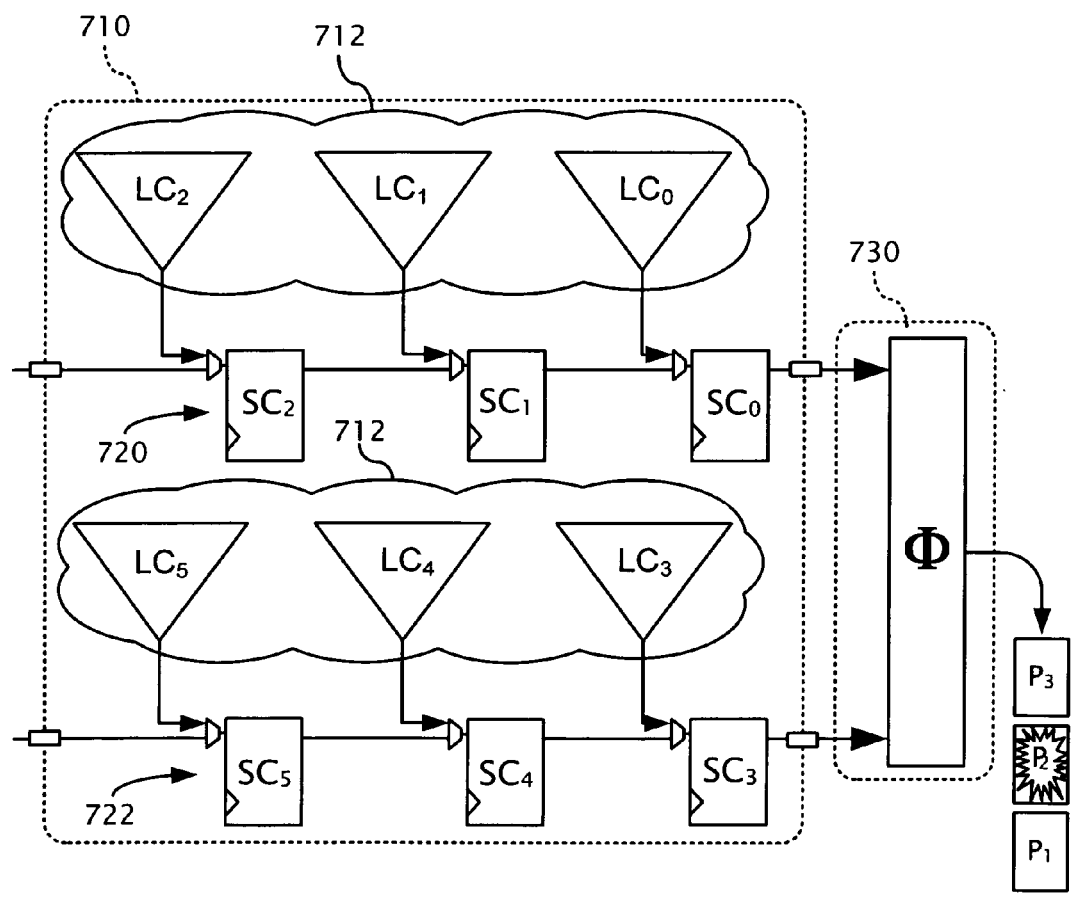
FIGS. 7A-7C are block diagrams illustrating how an embodiment of the method shown in FIGS. 5 and 6 can be applied to an exemplary scan-based circuit-under-test.

An exemplary application of the general method 500 is shown with reference to FIGS. 6, 7A, 7B and 7C. In FIG. 7A, an original circuit 710 comprises logic 712 having six logic cones $LC_0$ through $LC_5$ that feed six respective internal scan cells $SC_0$ through $SC_5$. The outputs of the two scan chains 720, 722 are coupled to the inputs of a compactor 730, which performs compaction according to some compaction function Φ and produces exemplary compacted test responses $P_1$ through $P_3$. Although not illustrated in FIG. 7A, different logic cones may have some common logic among them (that is, two or more of the logic cones may at least partially intersect). In such a scenario, faults from the intersecting logic can propagate to multiple scan cells, even to scan cells that are output during the same scan-out cycle.

With reference to the general method 500, at method act 502, a description of the original circuit 710 and compactor 730 (e.g., a netlist or HDL file) is received. At method act 504, the compaction function performed by the compactor 730 is determined. For example, the compactor 730 can be modeled as a function $\Phi_i$, such that $P_i=\Phi_i(C_i)$. Conceptually, the observed fault responses $P_i$ can be viewed as being captured in the $i^{th}$ pseudo-scan-cell (i=1, 2, 3, as in the pseudo-scan-cells 760, 762, 764 illustrated in FIG. 7B), and $C_i$ is a set of logic cones that at least partially determine the value at the corresponding pseudo-scan-cell. A logic cone $LC_j$ appears in set $C_i$ if it is at least partially determinative of the corresponding compacted test response $P_i$. At method act 506, the diagnostic procedure is modified to at least partially incorporate the transformation function $\Phi$, thereby allowing the procedure to be applied to the failing responses observed by the compactor. At method act 508, the modified diagnostic procedure is applied to the compacted test responses (e.g., to the responses recorded in a failure log from a tester).

FIG. 6 illustrates how a typical effect-cause diagnostic procedure can be modified at method act 506 and applied at method act 508 of the general method 500. Unless otherwise stated, the method illustrated in FIG. 6 is substantially similar to the effect-cause procedure 100 outlined above with respect to FIG. 1, except that the method of FIG. 6 operates on compacted results. For purposes of this example, assume that the design of the original circuit-under-test is as shown in FIG. 7A and as described above, and that the transformation function of the compactor has the following general relationship:

$$P_1=\Phi_1(\{0,1,2,3\}),$$

$$P_2=\Phi_2(\{0,4\}), \text{ and}$$

$$P_3=\Phi_3(\{2,4,5\}), \quad (4)$$

where the numerals represent the logic cones that produce the test responses compacted via the function $\Phi_i$ (e.g., "0" represents logic cone 0 and the test response it produces).

At method act 602, a failure log indicative of the failing responses to one or more test patterns in a circuit-under-test is received (e.g., from a tester). For purposes of the example illustrated in FIGS. 7A-7C, assume that a failure is observed in compacted test response $P_2$.

At method act 604, initial fault candidates for the failing responses are determined by path-tracing into logic cones of the circuit-under-test identified using the transformation function. In this example, for instance, the relationship between the compacted test response $P_2$ and the candidate logic cones contributing to the test response is given by $P_2=\Phi_2(\{0,4\})$, which can be used to identify the logic cones $LC_0$ and $LC_4$ as the logic cones that should be path traced for fault candidates. Note that the relationship need not specifically identify the actual function of the compactor (e.g., an XOR function), only the potential logic cone sources that at least partially determine the compacted test response. Thus, it is not necessary to calculate or use a reverse function $\Phi^{-1}$ in order to identify failing scan-cell candidates; instead, the relationship $\Phi$ can be applied to the compressed test responses and used to directly identify the logic cone candidates wherein a potential fault might exist. Further, no assumption concerning the number of failing scan cells that are output during a single scan-out cycle needs to be made, which can increase or maximize the solution space of possible fault candidates. According to one exemplary implementation, for instance, the initial fault candidate list comprises all faults identified in the union of logic cones $C_i$ as given by the relationship $P_i=\Phi_i(C_i)$ for a given failing response $P_i$.

Figure 7B:
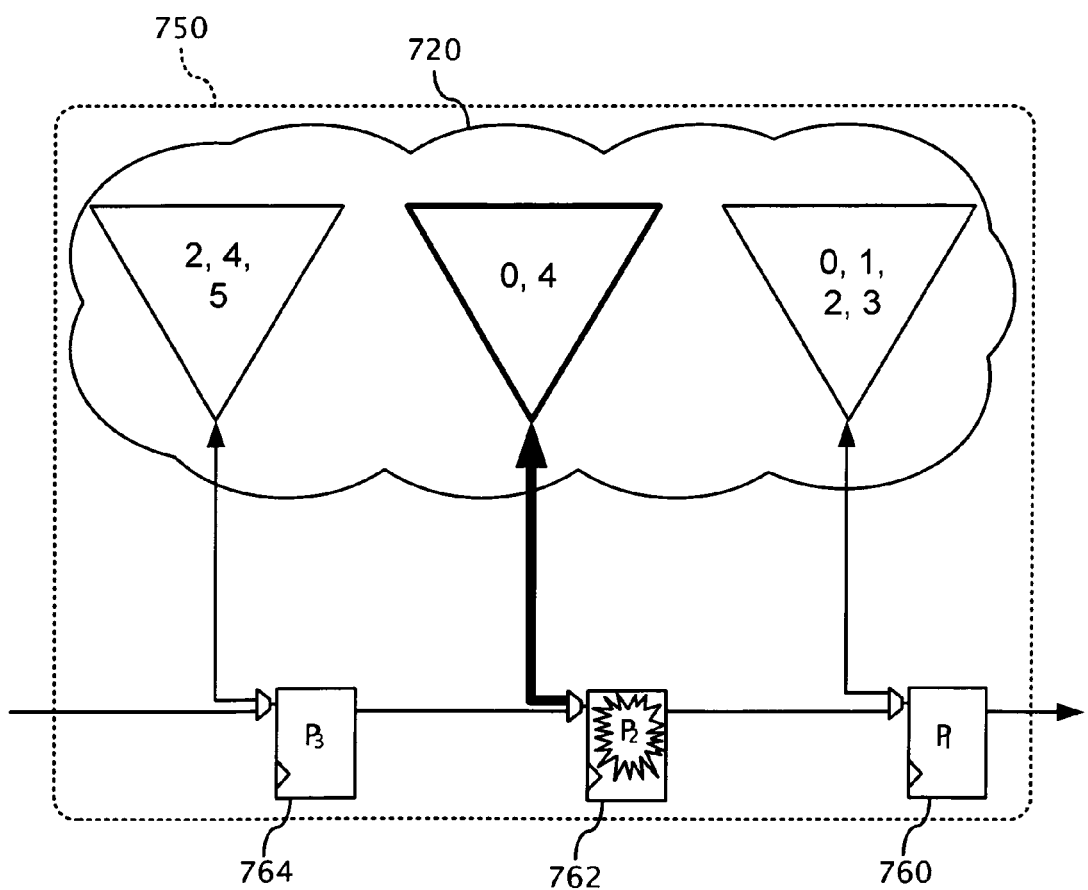

A conceptual representation of a transformed circuit-under-test 750 during this method act is shown in FIG. 7B. Specifically, FIG. 7B shows pseudo-scan-cells 760, 762, 764, which correspond to the compacted test responses $P_1$ through $P_3$ from the original compactor 730. As a result of the compactor modeling described above, it is known that the value at each of the pseudo-scan-cells 760, 762, and 762 must be at least partially determined by the following respective unions of logic cones: ($LC_0 \cup LC_1 \cup LC_2 \cup LC_3$), ($LC_0 \cup LC_4$), and ($LC_2 \cup LC_4 \cup LC_5$). Therefore, in one implementation, the initial fault candidates comprise all possible faults found during path tracing into the logic cone union $LC_0 \cup LC_4$. Note that in FIG. 7B and in the other figures of this disclosure, logic cone unions are denoted merely by the logic cone numbers in the union. Thus, the union of $LC_0 \cup LC_4$ is denoted as (0, 4).

If multiple failing responses $P_i$ are captured in scan cells upon application of a single test pattern, the list of initial fault candidates can be narrowed down by considering only those fault candidates that intersect between respective candidate lists. Returning to FIG. 6, at method act 606, the list of initial fault candidates is refined through simulation of the transformed circuit-under-test, wherein the simulation is adapted to incorporate the transformation function. For example, in one exemplary implementation, each fault in the suspect list is injected into the circuit and simulated. During simulation in this implementation, the transformation function is accounted for. Typically, this is done by using a mathematical function during the simulation (e.g., by calculating compacted test responses from respective captured scan cell values using the function $\Phi_i$), but may alternatively be performed by actually simulating the logic components of the compactor (e.g., using a circuit description that embeds the compactor upstream of pseudo-scan-cells). The results from the simulation at method act 606 are compared with the test responses observed and stored in the failure log. If the simulation results do not match with the actual observed results for the corresponding test pattern, then, in one implementation, the fault candidate is removed. In another implementation, all of the failing patterns are simulated for each fault candidate and a weighted criteria (such as the criteria described above with respect to FIG. 1) is utilized to evaluate how well the fault candidate explains the test responses for every failing pattern. In this implementation, if a fault candidate cannot explain the observed responses for any failing test pattern, it is removed from the list of fault candidates.

Figure 7C:
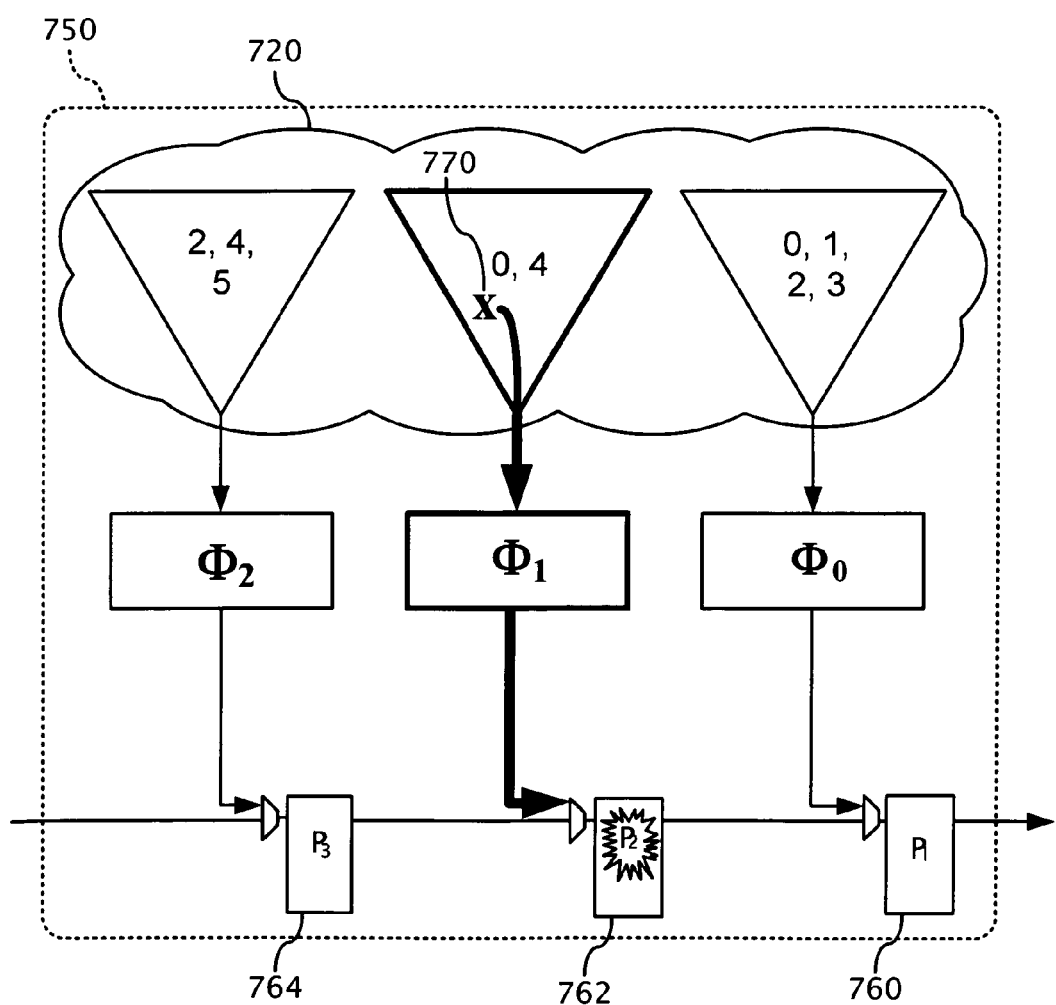

Forward simulation as may be performed at method act 606 is illustrated schematically in FIG. 7C, which shows a selected fault candidate 770 ("X") being propagated through logic cone union $LC_0 \cup LC_4$ during application of a test pattern (assumed for illustrative purposes to be the same test pattern applied when the corresponding failing test response was observed). In the illustrated simulation, the error caused by the fault candidate 770 is propagated to pseudo-scan-cell 762 (corresponding to $P_2$), but not pseudo-scan-cells 760 or 764 (corresponding to $P_1$ and $P_3$, respectively). (Note that in the forward simulation illustrated in FIG. 7C, the transformation functions $\Phi_1$, $\Phi_2$, and $\Phi_3$ are embedded into the simulation. That is, the functions $\Phi_1$, $\Phi_2$, and $\Phi_3$ are performed on the values output from the respective logic cones (0, 1, 2, 3), (0, 4), and (2, 4, 5), respectively). Accordingly, the fault candidate 770 produced the observed test response for the corresponding test pattern, and would remain on the list of fault candidates.

At method act 608, the remaining fault candidates are ranked. For example, any of the criteria used in known effect-cause diagnostic methodologies can be used.

Modifying the Circuit Description

Figure 8:
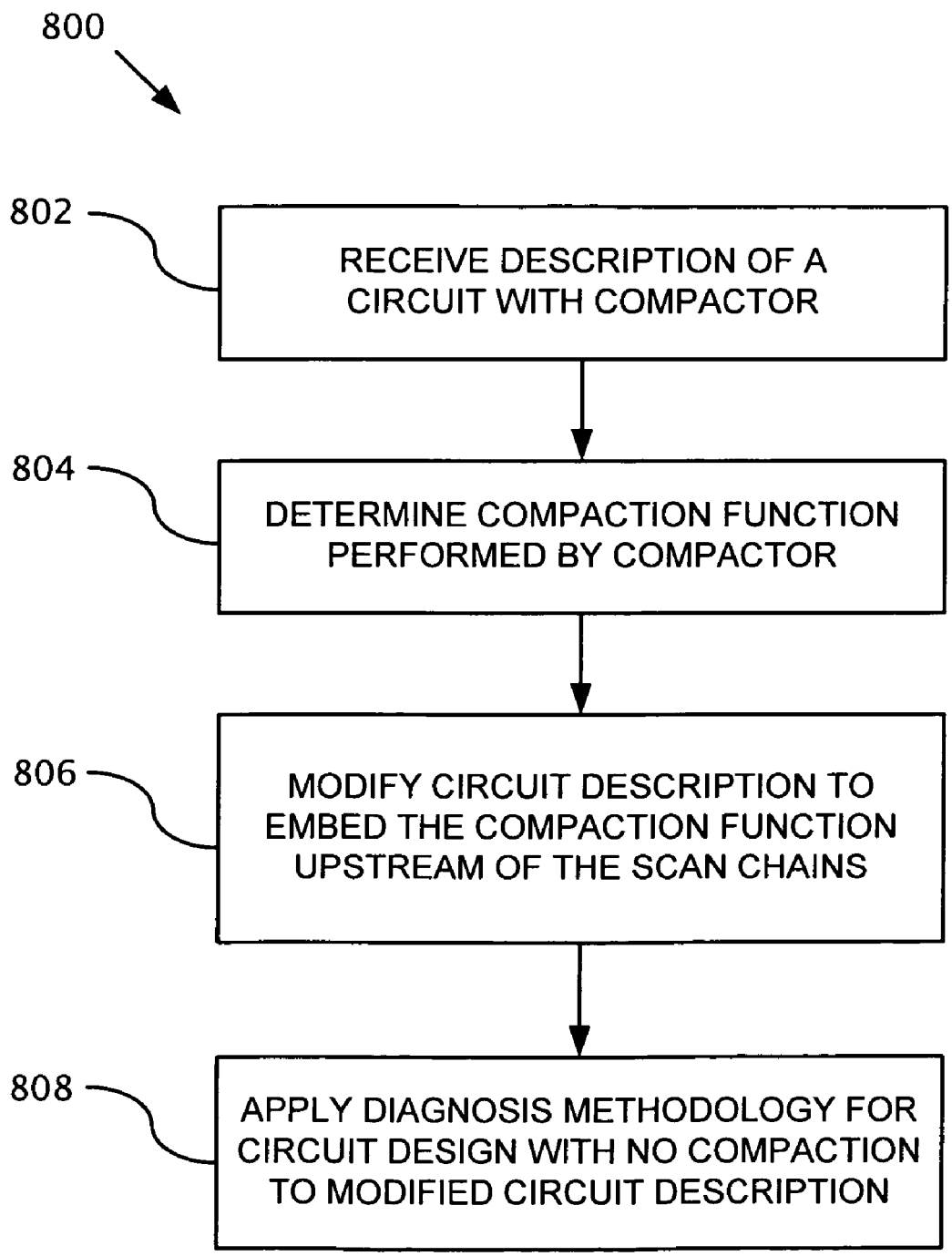
FIG. 8 is a flow chart of a second embodiment of an exemplary general fault diagnostic procedure for diagnosing faults from compacted test responses. In the embodiment illustrated in FIG. 5, a modified circuit description is used.

FIG. 8 is a flow chart illustrating a second general embodiment for performing fault diagnosis according to the disclosed technology. The method 800 shown in FIG. 8 can be applied to a wide variety of different compaction schemes and can utilize a variety of existing diagnostic algorithms. Further, embodiments of the method 800 can perform on-line diagnosis and/or account for multiple errors captured in a test response and output during a single scan-out cycle.

At method act 802, a description of a scan-based or partially-scan-based circuit and a corresponding compactor is received (e.g., a netlist or HDL file). At method act 804 a transformation function performed by the compactor (e.g., $\Phi$) is determined. At method act 806, the circuit description is modified so as to embed at least a portion of the compaction function upstream of one or more scan cells in the circuit. For example, the circuit description may be modified so that the compaction functions associated with selected scan cells are performed upstream of pseudo-scan-cells, but downstream of the respective logic cones that feed the pseudo-scan-cells. Consequently, one or more scan cells from the original circuit design are replaced by "pseudo-scan-cells" that capture test response values equivalent to the test responses values output from the compactor in the original circuit description. At method act 808, a diagnosis procedure for circuit designs having no compaction (e.g., one of the traditional effect-cause diagnostic procedures) is applied using the modified circuit description. In this embodiment, because the circuit description itself has been modified to embed the compaction function, no special modification of the diagnostic scheme is necessary (though modification is not necessarily excluded).

The general method 800 can be applied to any compactor that can be represented in terms of a transformation function $\Phi$. Moreover, because the resulting circuit transformation results in a circuit description that inherently accounts for the compaction function, any appropriate diagnostic procedure for uncompacted test response can be utilized.

Exemplary Applications of the Disclosed Direct Diagnosis Method to Compactor Signatures In order to illustrate various features and aspects of the disclosed technology, this section describes an exemplary application of the compactor-independent diagnostic procedure described in FIGS. 5 and 6 to signatures produced from time compactors, such as IR registers or MISRs. Although many embodiments discussed below refer to Logic BIST using MISRs, other test environments and compactors can also be used. The techniques described below can be used in conjunction with one or more techniques described above, or with one or more techniques described in U.S. patent application Ser. No. 10/925,230 filed Aug. 23, 2004, which claims the benefit of U.S. Provisional Patent Application No. 60/558,405 filed Mar. 31, 2004. U.S. patent application Ser. No. 10/925,230 is published as U.S. Patent Application Publication No. 2005/0222816, which is incorporated herein by reference.

Overview of Fault Diagnosis Using Per-Pattern Signatures

Figure 9:
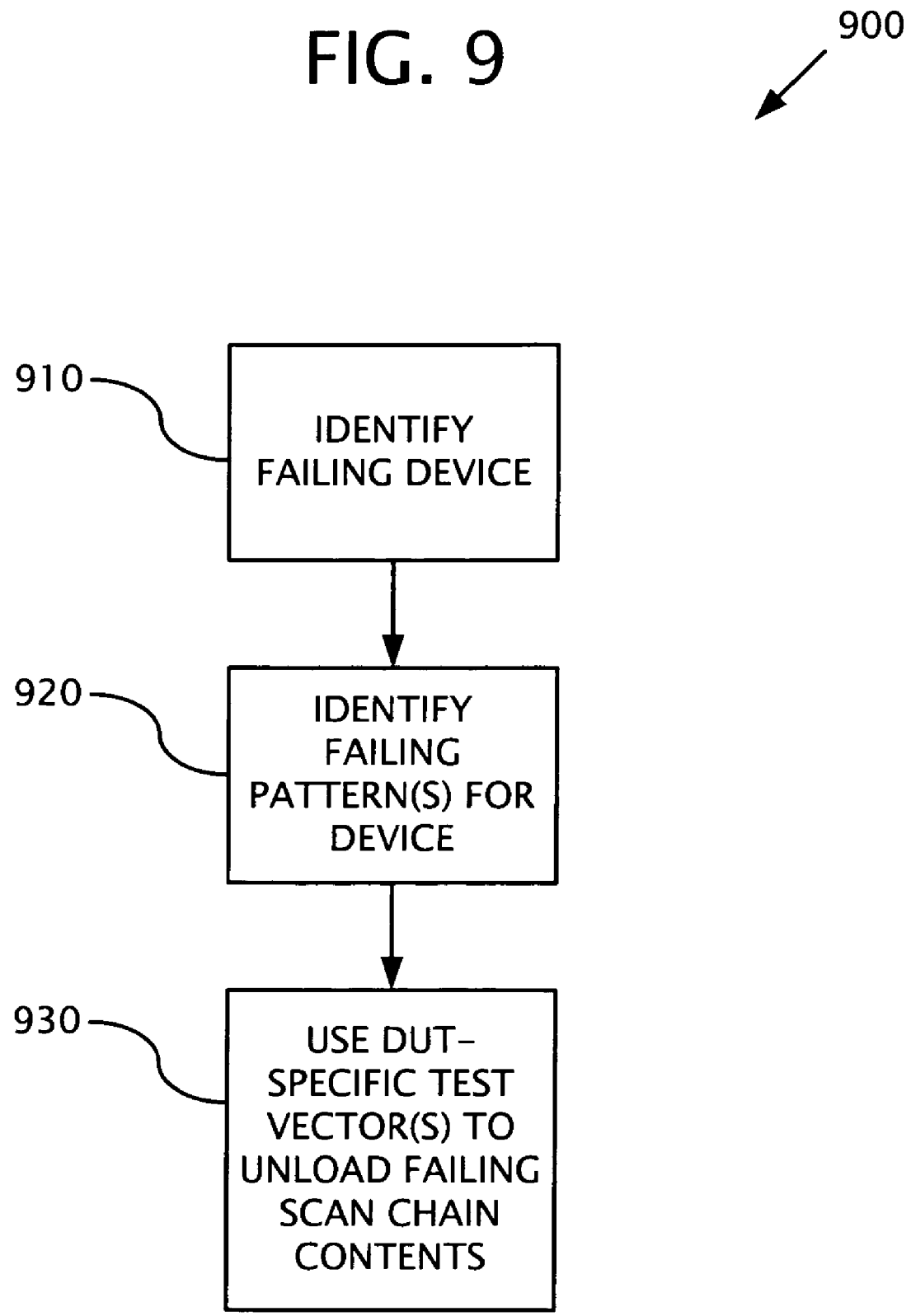
FIG. 9 is a block diagram of an exemplary method of performing Logic BIST diagnosis.

FIG. 9 shows a block diagram of a conventional technique 900 for performing Logic BIST diagnostics. The technique 900 comprises identifying a failing device (method act 910). For example, a single MISR signature can be unloaded at the end of a test. The test patterns in the test can be reapplied and the MISR signatures can be evaluated to identify failing patterns for the failing device (method act 920). For example, the MISR signature can be unloaded and reset at the end of each test pattern, or a binary search can be performed. Device-Under-Test (DUT) specific test vectors can be used in a bypass mode to unload failing scan chain contents (method act 930). For example, instead of unloading scan chains into the MISR, the DUT is placed into a bypass mode, and the scan chain contents are unloaded via one or more top-level pins. The use of DUT-specific test vectors and the use of a binary search procedure often creates a tight link between the tester and the software that generates these dynamic vectors, as the list of failing patterns can be different for different devices under test. Accordingly, instead of statically generating a test set (and translating the test set into a tester format), test operations are performed at run time (i.e., dynamically). For example, to dynamically create and apply a test set based on the failing per-pattern MISR signatures for a specific DUT, the following procedure can be performed: (1) a per-pattern MISR signature failure log is retrieved from a tester; (2) failing cycle and time information is analyzed to identify failing patterns; (3) a DUT-specific test set is generated that reapplies at least some of the failing patterns and unloads the complete scan chain contents; (4) if desired, the test set can be translated to a tester format (e.g., from WGL/STIL format to a tester format); and (5) the DUT-specific test set is run and a failure log is retrieved. Portions 1-4 of this procedure are typically performed in "real-time" by a tester on the tester floor that operates with specialized test-set-generating software. While traditional testers are designed for use with ATPG vectors and work well in batch-oriented flows, automated support for dynamically generated test vectors usually requires modifications to the tester and the development of the corresponding Logic BIST software.

As is explained below, in certain embodiments of the disclosed technology, potential fault candidates can be identified directly from the MISR signatures (e.g., using signatures available from the MISR when it is being used to identify failing patterns). Thus, dynamic vector generation can be eliminated. Furthermore, embodiments of the resulting diagnostics flow work well with batch-oriented testers and do not require a special tester interface. In certain embodiments of the disclosed technology, compactor-independent direct-diagnosis techniques as described, for example, in U.S. Patent Application Publication No. 2005/0222816 are extended to MISR signatures.

In general, one signature from all BIST patterns is ordinarily insufficient for diagnosis. However, if a smaller interval is considered (e.g., one signature per pattern), the information can be sufficient to perform diagnosis. Exemplary embodiments of the disclosed technology that identify fault candidates from a signature are referred to in this disclosure as "signature-based diagnosis." Using embodiments of the signature-based diagnosis technique, the MISR does not have to be bypassed to acquire relevant failure data.

Figure 10:
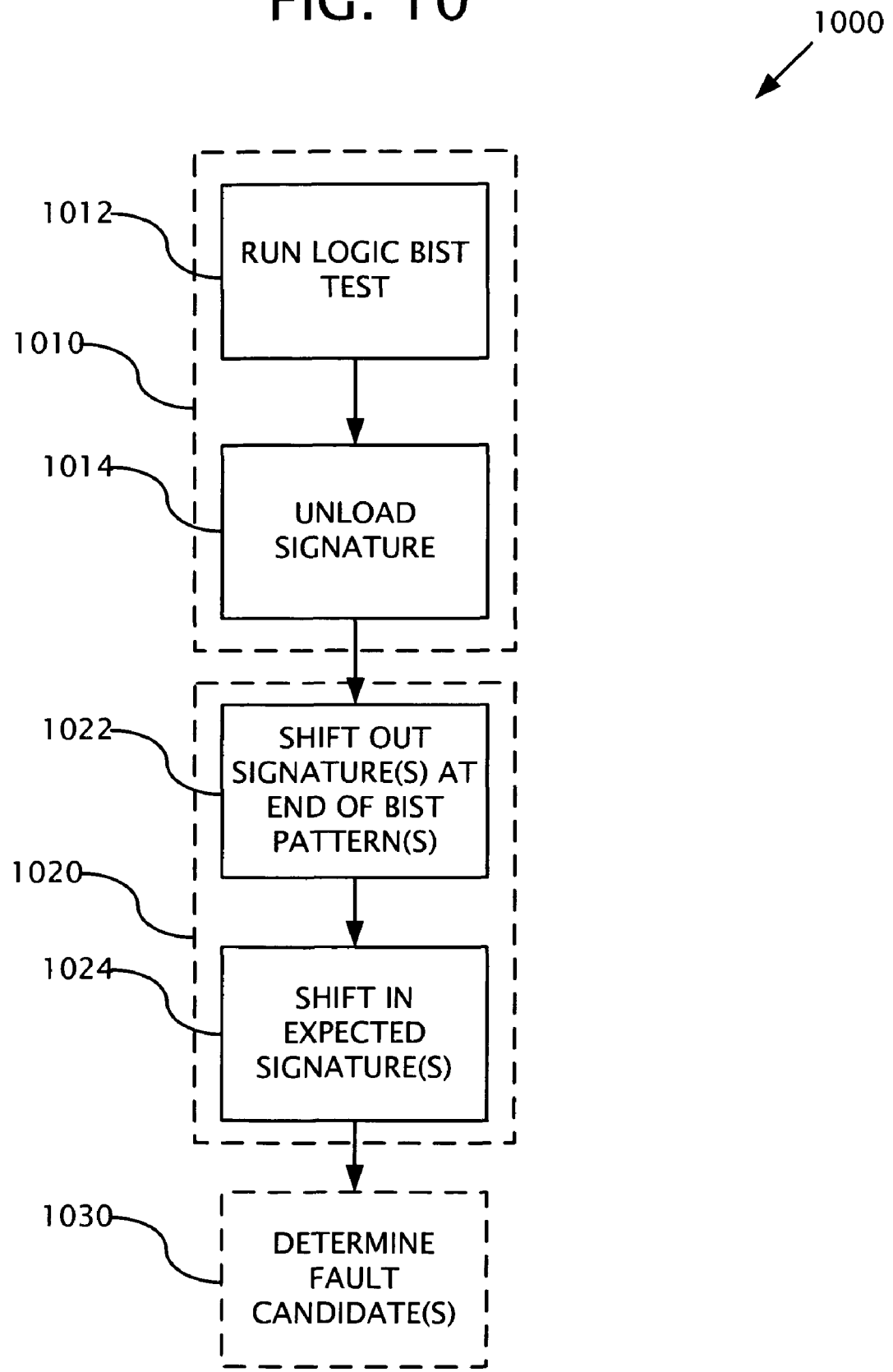
FIG. 10 is a flow chart of one embodiment of a method of performing Logic BIST diagnostics.

FIG. 10 shows one embodiment of a signature-based diagnosis method 1000 according to the disclosed technology in which at least two phases are used in a BIST test flow. In a first phase (shown at 1010), a Logic BIST test is run using a plurality of test patterns (method act 1012) and test responses to the test patterns are compacted into one MISR signature, which is unloaded and compared to an expected signature (method act 1014). Based on the final signature, a determination can be made as to whether a device is defective. If the device is determined not to be defective, testing is complete; if the device is determined to be defective, testing can proceed to a second phase. This approach can identify failing devices while reducing data volume and test time.

In certain embodiments of the disclosed technology, the second phase (shown at 1020) involves a BIST operation (not shown) similar to the first phase, but the MISR is unloaded on a per-pattern basis (e.g., after each pattern is finished) (method act 1022). To help ensure that the MISR signature of a pattern is independent of other failing patterns, the MISR signature can be reset at the beginning of each pattern. In some embodiments, and as illustrated in FIG. 10, instead of resetting the MISR with constant values, the MISR can be loaded with an expected signature (e.g., a signature of a good machine) (method act 1024). In some embodiments, the expected signature can be shifted into the MISR while the actual test signature is being unloaded. In other embodiments, these acts can be performed as two separate method acts. Synchronization logic in the BIST controller can be used to shift signatures into and out of the MISR. In this way, both phases can have the same good circuit simulation to save simulation time.

As is explained below, according to certain embodiments, a list of candidate fault sites (or defect locations) can be directly determined from the per-pattern MISR signatures shifted out (and, in some embodiments, from only the per-pattern MISR signatures) (method act 1030). In other embodiments, this can involve analysis of MISR signatures that are unloaded on a basis that is different than a per-pattern basis. For example, the MISR signatures after two, three, or some other desirably low number of patterns can be analyzed. Moreover, in some embodiments, partial MISR signatures can be analyzed. For example, two or more partial signatures can be analyzed per pattern.

For instance, and as more fully explained below, an exemplary analysis technique that can be used in connection with the disclosed technology comprises computing the Boolean equations that define the value of each bit in the MISR register as a function of the scan cell contents (assuming a reset to known values at the end of each pattern), and using these equations, along with a list of failing MISR bits to infer potential fault sites for each pattern. Subsequent analysis method acts can be performed to combine results from multiple failing patterns (as defined by failing MISR signatures) and/or to rank the impact of each potential fault candidate on non-failing patterns. Before describing exemplary diagnostic techniques in further detail, an exemplary implementation of BIST hardware (as may be used to help implement the diagnostic technique) is introduced.

Exemplary BIST Controller Architectures

Exemplary embodiments of suitable BIST controllers as can be used with the disclosed technology follow the STUMPS architecture and comprise a state machine configured to control the BIST session.

Table 1 briefly describes the basic components of an exemplary BIST controller:

TABLE 1

Exemplary Logic BIST Controller Components

| Component Name | Function |
| --- | --- |
| PRPG (Pseudo-random pattern generator) | Load pattern data into scan chains |
| MISR (Multiple Input Signature Register) | Generate signature based on data unloaded from scan chains |
| Pattern counter | Track total number of patterns that have been applied |
| Shift counter | Track number of shift cycles applied for this pattern |
| Controller | State machine controls sequencing of test - transitions from shift to capture, etc. |

TABLE 1-continued

Exemplary Logic BIST Controller Components

| Component Name | Function |
| --- | --- |
| Clock generator | Generate internal clock signal used during shift operations, and also high speed clock pulses during capture |
| Interface logic | Control registers define parameters of current run - includes initial PRPG value, number of patterns, etc. |

In order to support at-speed operation, embodiments of the Logic BIST controller can be driven by a single high-speed clock. This high speed clock can be used, for example, to generate a slower internal clock that drives the logic (e.g., the PRPG, the MISR, and other such components) during shifting. During the capture window, high-speed clock pulses can be injected into the core using the clock generator circuit.

In particular embodiments, the Logic BIST hardware further comprises several so-called "configuration registers" that are used to define certain performance parameters, such as the initial PRPG and MISR values and the total number of patterns to apply. In one implementation, for example, the Logic BIST test can be controlled via an 1149.1 compliant interface. According to this implementation, the interfacing registers (including the current MISR value) are desirably accessible via an asynchronous interface that is driven from the clock signal (typically named "tck") used by the 1149.1 interface. The control registers in the interface block can be driven using "tck." When a new value has been loaded into these registers, a signal can be sent, for example, to the state machine. This signal can be used to trigger the transfer of the stable value from the registers in the interface block (driven by "tck" in this example) into the appropriate internal registers driven by the free running BIST clock ("bist_clk").

The internal sequencing of operations within the BIST controller is ordinarily driven from the state machine. In order to provide a mechanism for unloading and re-loading the MISR at the end of each pattern, and according to one exemplary embodiment, the state machine can be configured so that it will go into a wait state after performing the capture operation. For example, the interface logic (typically driven from "tck") can send a signal to the state machine once the current MISR value has been unloaded and the "expected" MISR value has been re-loaded. Given an architecture that already supports the use of an asynchronous interface for accessing internal configuration registers, the additional logic that is required to support such a diagnostics mode is generally not substantial.

Figure 11:
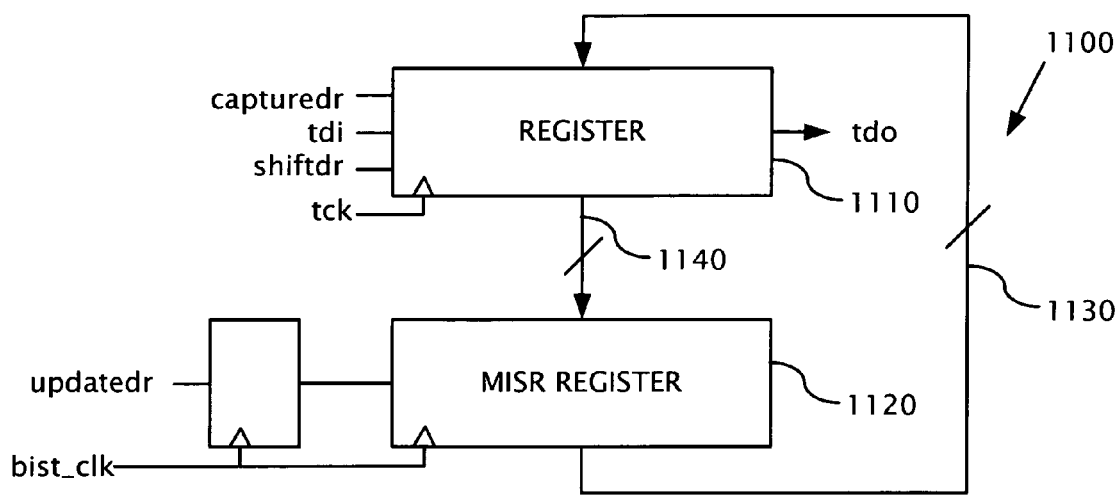
FIG. 11 is a block diagram of exemplary BIST synchronization logic.
Figures 12, 13:
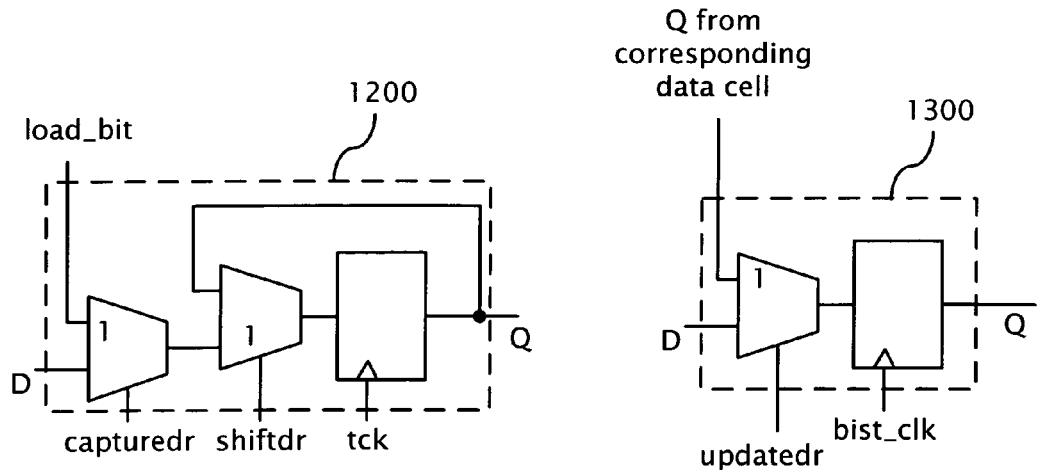
FIG. 12 is a block diagram of an exemplary data cell.
FIG. 13 is a block diagram of an exemplary MISR cell.

FIG. 11 is a block diagram of exemplary BIST synchronization logic 1100. The logic 1100 comprises a register 1110 comprising a plurality of data cells (e.g., comprising flip-flops or other suitable sequential elements) coupled in series, as well as a MISR register 1120 comprised of a plurality of MISR cells (e.g., also comprising flip-flops or other suitable sequential elements) coupled in series. FIG. 12 is a block diagram of an exemplary data cell 1200 as can be used as a respective data cell in the register 1110. FIG. 13 is a block diagram of an exemplary MISR cell 1300 as may be used as a respective MISR cell in the MISR register 1120. Although not shown, in the register 1110 the Q output paths of the data cells are coupled to the D input paths of adjacent data cells (except for the last data cell, which has a Q output path coupled to the tdo output path, and the first data cell, which has a D input path coupled to the tdi input path). Additionally, the Q output paths of the data cells 1200 are coupled to respective input paths of a multiplexer in a corresponding MISR cell in the MISR register 1120. Similarly, the Q output paths of the MISR cells are coupled to an intermediate logic gate (e.g., an XOR gate, not shown in FIG. 11 but illustrated in FIGS. 16-18) between adjacent MISR cells in the MISR register 1120. In some cases, the Q output path of one MISR cell can be coupled to an intermediate logic gate of another MISR cell according to the feedback polynomial implemented by the MISR. Additionally, the Q output path of a MISR cell can also be coupled to the load_bit input path of a respective data cell 1200 in the register 1110.

In operation, the register 1110 can load a signature generated in the MISR register 1120 through respective load_bit input paths (e.g., via bus 1130) once the signature is complete and when signals on the capturedr and shiftdr paths are high. Once loaded into the register 1110, the captured signature can be serially unloaded through the tdo output path. For example, in the illustrated embodiment, this shifting occurs when the signal on the shiftdr path is high and the signal on the capturedr path is low. Simultaneously, an expected signature can be serially loaded into the register 1110 through the tdi input path. When the expected signature is loaded, and before the next signature from the MISR register 1120 is received, the data register 1110 is typically operated in a stable, hold state. For example, in the illustrated embodiment, this hold state occurs when the signal on the shiftdr path is low.

In the illustrated embodiment, the expected signature stored in the data register 1110 can be loaded into the MISR register 1120 (e.g., via bus 1140) when the signal on the updatedr path is high. In certain exemplary embodiments, the test set is designed such that the signal on the updatedr path remains low while a new expected MISR value is serially shifted into the register 1110. (This is consistent with the normal operation of a JTAG interface). Once the new expected value has been loaded into register 1110, the tester generates a cycle when the signal on the updatedr path is high. This triggers the transfer of the value into the MISR register 1120 via bus 1140, and also causes a state machine (not shown) in the Logic BIST controller to begin applying the next pattern. The tester generates a sufficient number of cycles with the signal on the updatedr path held low to allow the Logic BIST controller to complete the application of a single BIST pattern. At the end of this period, the MISR register 1120 is once again in a stable state. The tester will then generate a cycle that pulses the signal on the tck path while the signal on the capturedr path is high. This transfers the current MISR value from MISR register 1120 into the register 1110 via bus 1130. This procedure is repeated for one or more other BIST patterns (e.g., for all of the BIST patterns).

Exemplary Embodiments of Signature-Based Diagnosis

As noted, certain embodiments of the disclosed signature-based diagnosis technique can be used to identify possible failing locations from a failing MISR signature for a failing pattern without requiring any additional information. In general, these embodiments receive as input failing MISR signatures and the corresponding failing patterns and output suspect failing locations that best describe the failing signatures.

Figure 14:
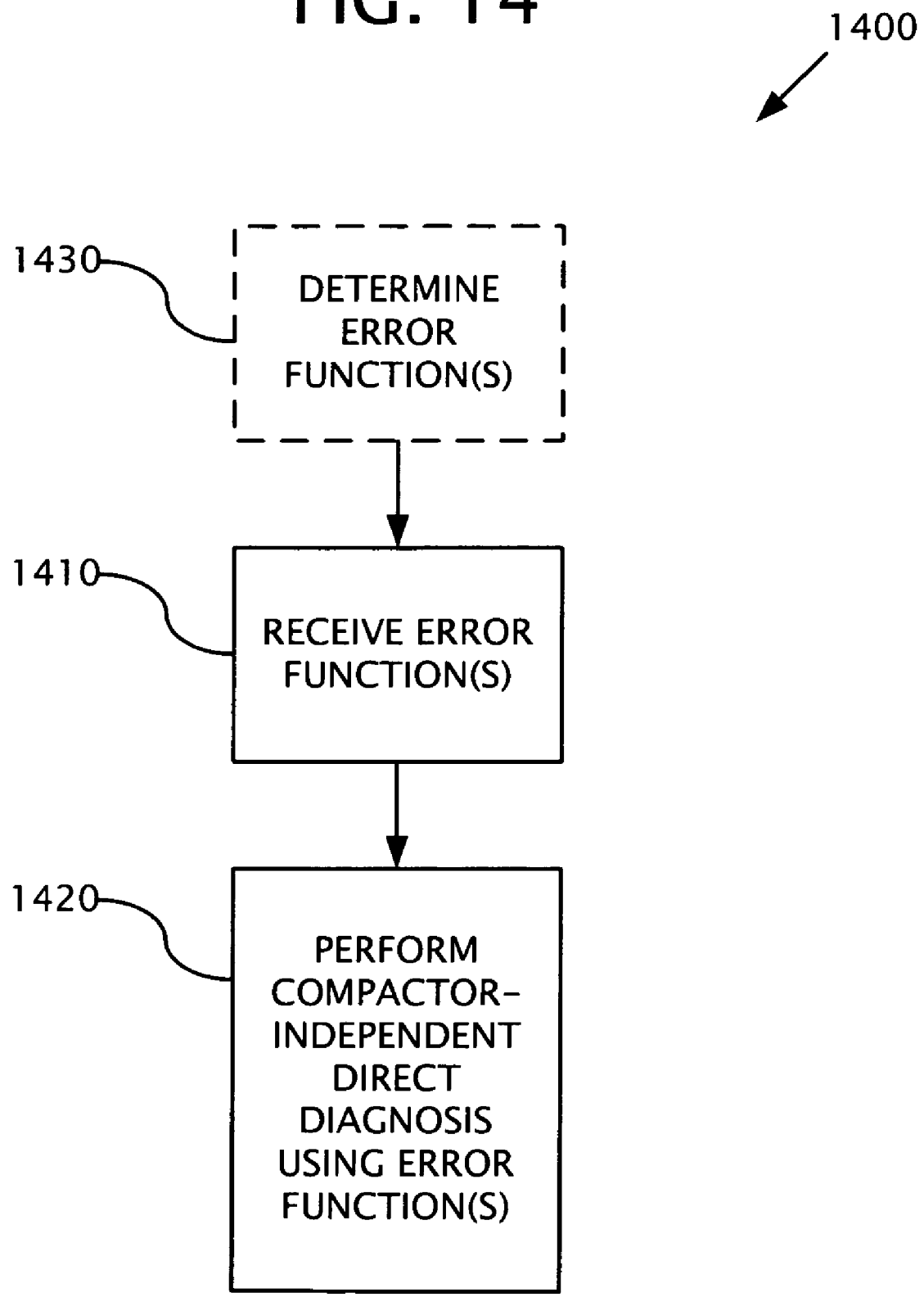
FIG. 14 is a block diagram of one embodiment of a signature-based diagnosis technique.

FIG. 14 is a block diagram of one embodiment of a signature-based diagnosis technique 1400, which comprises generating one or more error functions (method act 1410) and using the error function(s) to perform compactor-independent direct diagnosis (method act 1420). The error function(s) can be determined, for example, before testing is performed (method act 1430). An error function describes how errors in the scan cell unload values affect a MISR signature, e.g., it describes the association between one or more scan cells in the design and the bits of a signature generated by a compactor.

The next three sub-sections describe the methods acts of technique 1400 in more detail. First, the meaning of the error function is described. Next, examples of methods for determining this error function for an exemplary LBIST MISR compactor are disclosed. Finally, exemplary techniques for using the error function in diagnosis are disclosed. For illustration purposes only, an example circuit in which the number of scan chains is equal to the MISR size is discussed. It should be understood that this example serves to illustrate the general concepts of the disclosed technology and should not be construed as limiting. The techniques described are readily extensible to other configurations (e.g., other LBIST configurations, such as configurations where an XOR-tree space compactor is present between the scan chains and the MISR).

A. The Error Functions

As mentioned above, the error function describes how failing scan cell unload values affect the MISR signature. In other words, the error function is indicative of which scan cells in the electronic circuit design at least partially contribute to the value of failing compactor bits in a compactor signature. This subsection describes one exemplary manner for determining the error function. In order to describe the error function more formally, some terminology is first introduced. Let $sc_{ij}$ denote a scan cell in the design where i denotes the scan chain number (i=0 being the scan chain connected to the least significant MISR bit), and j denotes the scan cell number within the chain (j=0 being the scan cell closest to scan out). Let $e_{ij}$ be a Boolean variable which is equal to "1" (in this example) if there is an error in the scan unload value in scan cell $sc_{ij}$ (that is, if the unload value for scan cell $sc_{ij}$ is not what is expected) for some failing test pattern. Let e be the vector of all $e_{ij}$ variables (e=[$e_{00}$, $e_{01}$, ...]). In other words, the vector e of this embodiment describes the positions of all the scan cells which have erroneous values for some failing test pattern.

The error function can be defined for each MISR bit, for example, as a Boolean-valued function in e. For the k-th MISR bit, this function is denoted by $\epsilon_k(e)$. The error function is "1" for all those (and only those) values of e such that if the corresponding failing test pattern is unloaded into the MISR, the k-th MISR bit in the resulting signature will have an erroneous value. Note that since the MISR is a linear device, the location of failing MISR bits in the MISR signature corresponding to a failing test pattern does not depend on the actual scan unload values; instead, the location depends on which scan cells contain erroneous values for the failing test pattern. This property allows the error function to be defined in the above manner.

The exemplary logic values used in the above description should not be construed as limiting, as the actual values may vary depending on the implementation.

B. Determining the Error Function

Figure 15:
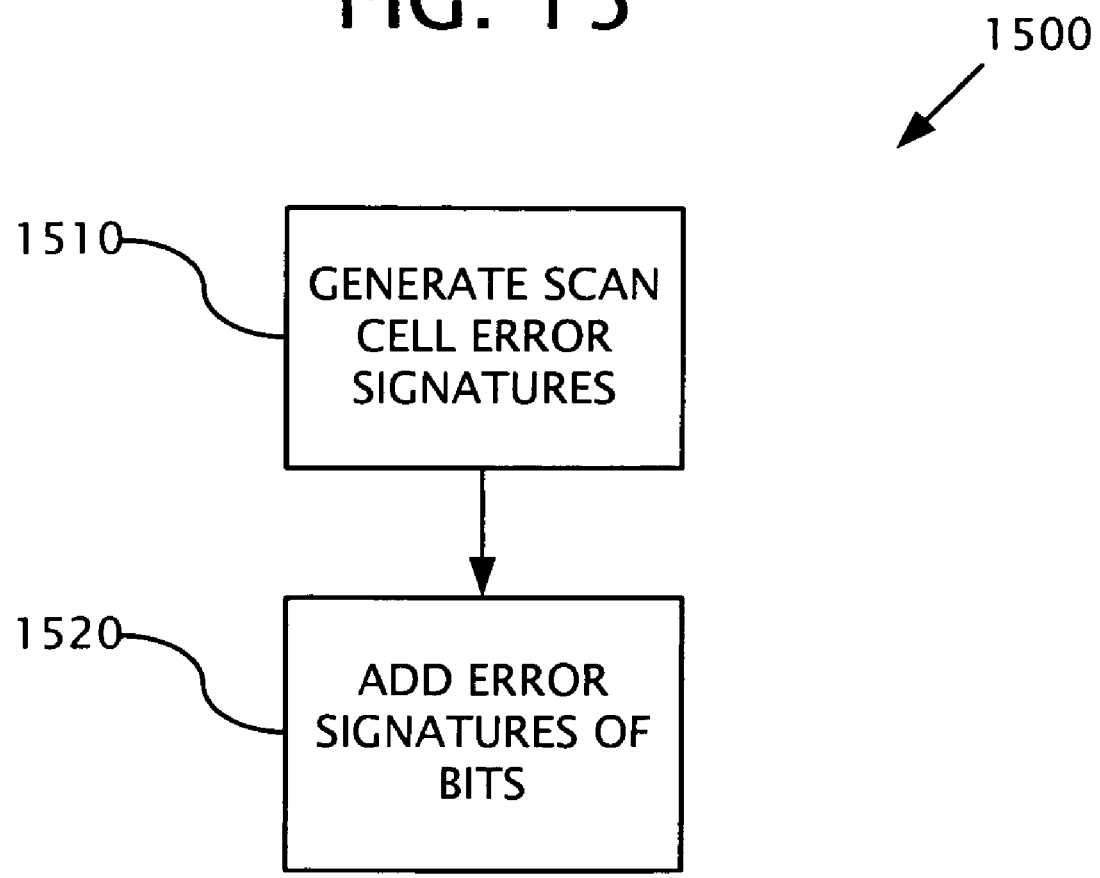
FIG. 15 is a flow chart of an exemplary technique of determining an error function for a MISR bit.

FIG. 15 shows a block diagram of an exemplary technique 1500 for determining the error function of a MISR bit. An "error signature," which describes the manner in which a single scan cell will affect the MISR signature, is determined (method act 1510). Based on the linearity of the MISR compactor, error signatures for a corresponding MISR bit can be added (method act 1520) in order to obtain a corresponding error function for the MISR bits. The effect of an error in a single scan cell, say $sc_{ij}$ can be determined by simulating the process of unloading the scan cell values into the MISR. In order to perform this procedure, for example, the unload values for all scan cells, except $sc_{ij}$, can be set to a non-error value such as "0" to simulate these cells as not containing errors. The unload value for cell $sc_{ij}$ can be set to the symbol $e_{ij}$. The MISR initial values can also be set to "0". The MISR signature corresponding to the above unload values can then be determined by simulating the process of unloading these values into the MISR.

Figure 16:
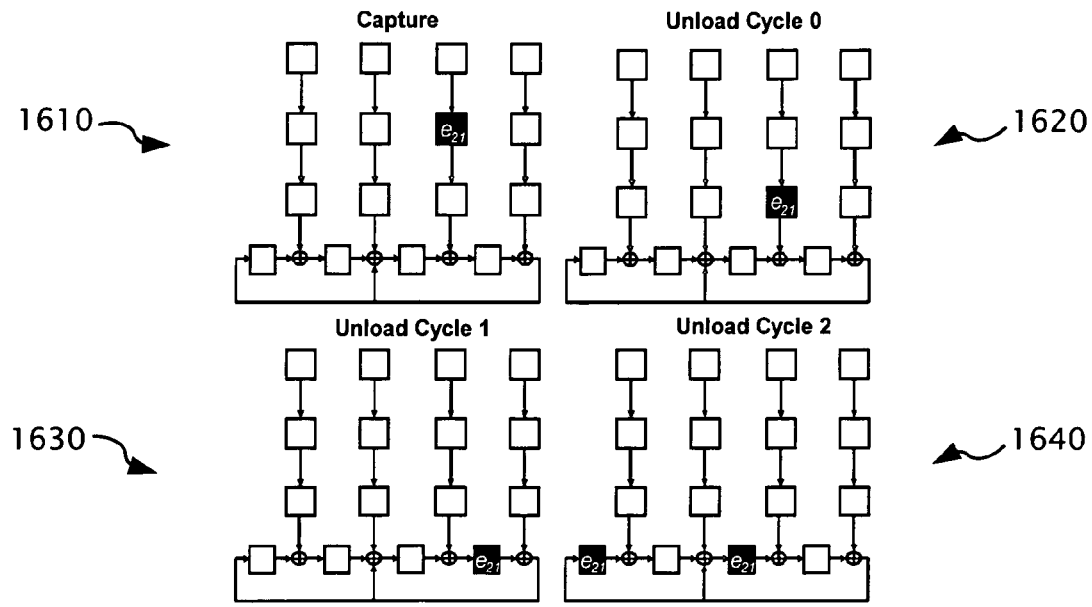
FIG. 16 is a diagram of an exemplary simulation technique for an error in a circuit.

FIG. 16 is a diagram illustrating an exemplary simulation technique for an error in an LBIST compactor configuration. As seen in each of the four phases 1610, 1620, 1630, 1640, the illustrated circuit comprises four scan chains with three scan cells, each chain unloading into a four-bit MISR. FIG. 16 illustrates the exemplary simulation technique for an error in $sc_{21}$, while FIG. 17 similarly illustrates the exemplary simulation technique for an error in $sc_{22}$ in phases 1710, 1720, 1730, 1740. Phases 1610 and 1710 are capture phases, in which values are loaded into scan cells. Phases 1620, 1630, 1640 and 1720, 1730, 1740 are unload cycle phases, in which scan cell values are being shifted into a MISR. In a similar manner, the error signatures for other scan cells in the design can be obtained. These error signatures can then be added for a selected MISR bit to obtain the error function for that bit. For the example circuit of FIGS. 16 and 17, this is illustrated in FIG. 18, which is a diagram of an exemplary technique for determining error functions for one or more MISR bits of the circuit of FIGS. 16 and 17. (In this application and in the accompanying claims, at least with respect to generating an error function, "simulation" can comprise both techniques using hardware representations, as well as techniques using functional representations. The latter techniques are sometimes known as "emulation.")

Figure 17:
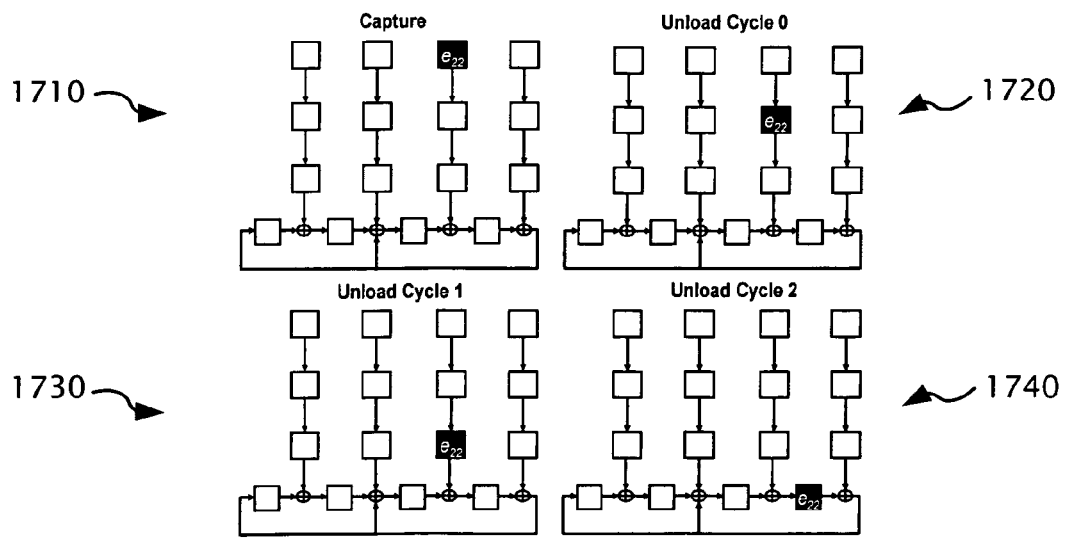
FIG. 17 is a diagram of an exemplary simulation technique for an error in a circuit.
Figure 18:
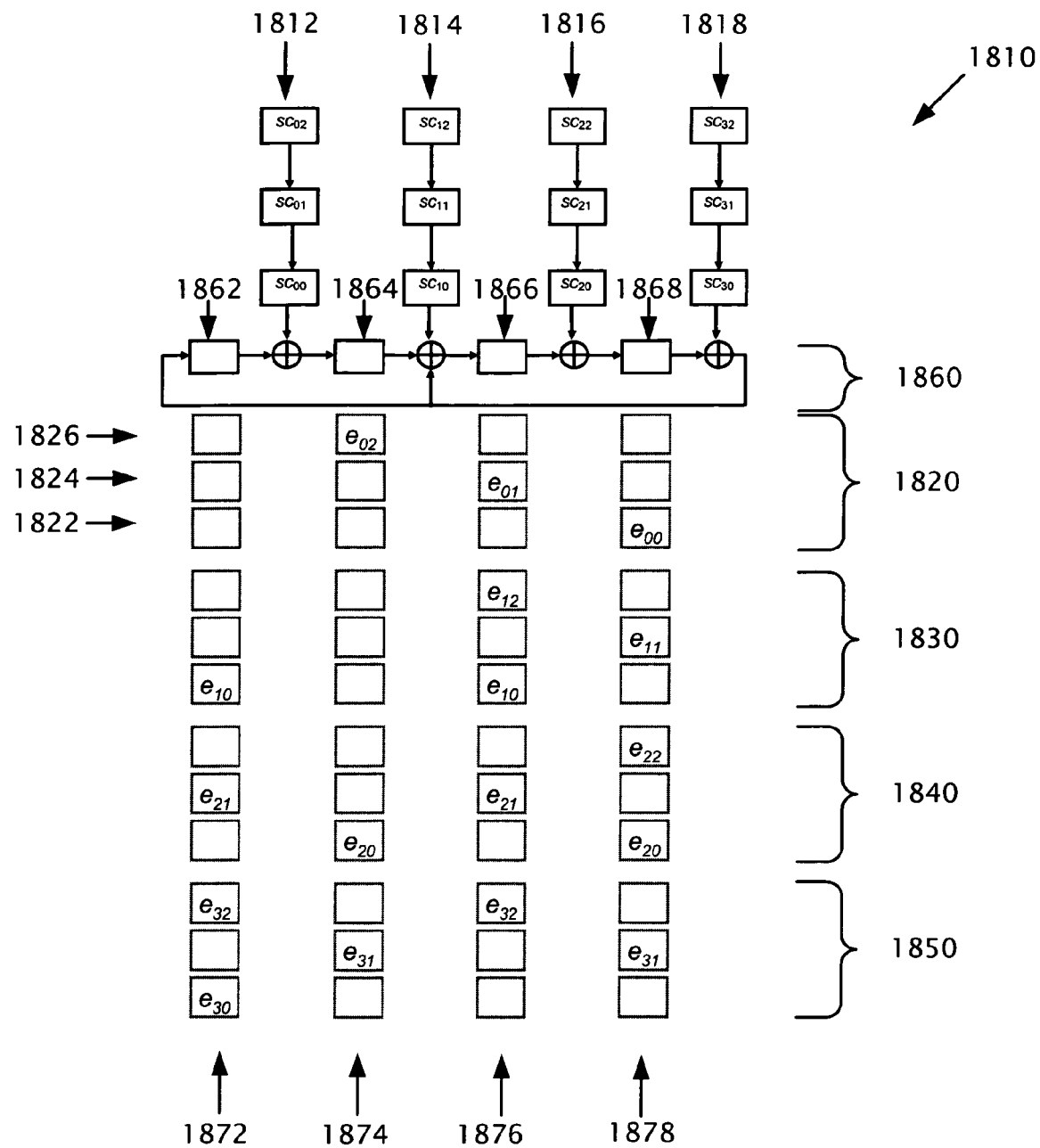
FIG. 18 is a diagram of an exemplary technique for determining error functions for one or more MISR bits of the circuit of FIGS. 16 and 17.

FIG. 18 depicts a circuit 1810 which, similar to the circuits shown in FIGS. 16 and 17, comprises four scan chains 1812, 1814, 1816, 1818 of three scan cells each, along with a four-bit MISR 1860. Output groups 1820, 1830, 1840, 1850 represent examples of the data that can be unloaded into the MISR 1860 during three unload cycles, as was similarly shown in FIGS. 16 and 17. Columns 1872, 1874, 1876, 1878 represent data that affect values on MISR bits 1862, 1864, 1866, 1868, respectively, after three unload cycles.

For example, output group 1820 represents the effect of error data shifted out of scan chain 1812 during three unload cycles. Row 1822 represents the effect of error data $e_{00}$ after three unload cycles; row 1824 represents the effect of error data $e_{01}$ after three unload cycles; and row 1826 represents the effect of error data $e_{02}$ after three unload cycles. Because of the feedback loops in the MISR, error data from a single scan cell can sometimes affect the value of multiple MISR bits (see, e.g., output groups 1830, 1840, 1850).

Note that in FIGS. 16, 17 and 18 symbolic simulation is used for the sake of clarity. In other implementations, symbolic simulation is not used, and the error signatures and error functions are determined using other methods (e.g., conventional binary logic simulation).

A brute force implementation of the technique described above would result in the simulation of n·l scan shift cycles, where n is the total number of scan cells in the design and l is the number of shift cycles in one unload. However, the process can be made more efficient by avoiding repetitive steps. For example, it can be seen in FIG. 17 that the error signature for scan cell $sc_{22}$ is the same as the error signature obtained at the end of the second shift cycle while the signature for scan cell $sc_{21}$ is being computed. In other words, the error signature for $sc_{22}$ is also determined while the error signature for $sc_{21}$ is being computed.

In general, the error signature for $sc_{i(j+x)}$ can be determined in the course of computing the error signature for $sc_{ij}$. This property results because the former error signature is just structurally shifted x shift cycles behind the latter. Therefore, in certain embodiments of the disclosed technology, simulation is run for the zero-th scan cell, $sc_{i0}$, in each scan chain, and the error signatures for the other scan cells in the scan chains are computed during the simulation. This exemplary procedure reduces the number of shift cycles to be simulated to m·1 where m is the number of scan chains in the design.

The exemplary technique described above can be extended to alternate LBIST compactor configurations (e.g., where there is an XOR-tree space compactor preceding the MISR and other such configurations).

C. Using the Error Function in Diagnosis

Figure 19:
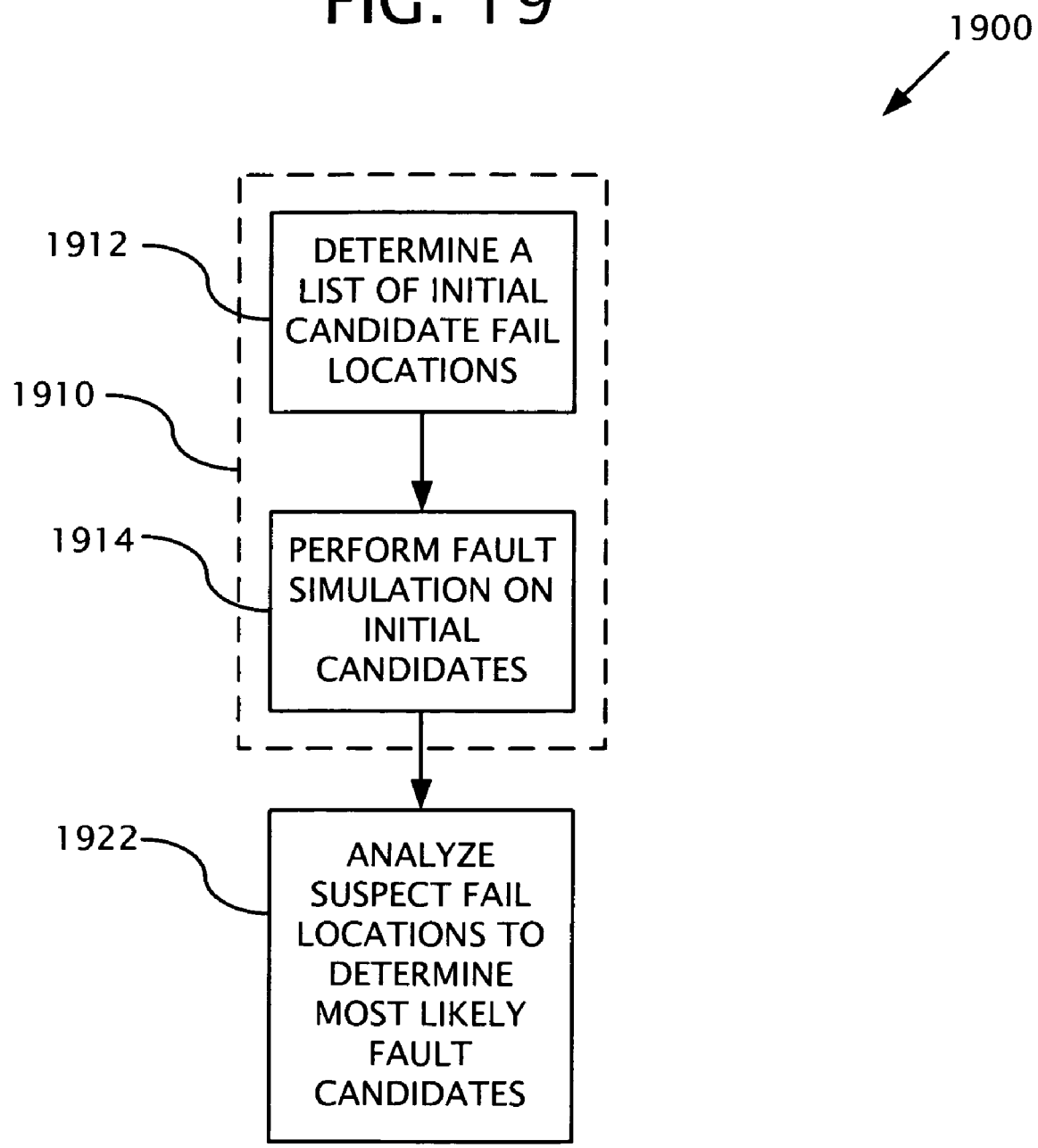
FIG. 19 is a flow chart of an exemplary logic diagnosis technique.

FIG. 19 shows a block diagram of an exemplary logic diagnosis technique 1900. The technique comprises finding, for a failing test pattern, failing locations that explain the observed failure (method act 1910). In some embodiments, this is done using the single-location-at-a-time paradigm. (The single-location-at-a-time paradigm is described in, for example, T. Bartenstein et al., "Diagnosing Combinational Logic Designs using the Single Location At-A-Time (SLAT) Paradigm," in *Proc. Intl. Test Conf*, pp. 287-296 (2001).) More particularly, method act 1910 can comprise: determining a list of initial candidate defect locations (also referred to as "fault locations") through, for example, critical-path-based back cone tracing from scan cells identified by one or more error functions (method act 1912); and performing fault simulation on the initial candidates found for the current failing pattern in order to determine which candidate fault locations can explain the observed failing behavior for the current pattern (method act 1914). The technique 1900 can further comprise analyzing the suspect fault locations found to determine the most likely candidates, as well as to check fault activation conditions (method act 1922). This procedure can further identify failure causes (e.g., bridges, opens, and other such failure causes).

For a circuit without any compaction, the fail information can typically be indicative of which scan cells are failing for each failing pattern so that performing back cone tracing is straightforward. However, for the case of LBIST, only the failing MISR signature for each failing pattern is typically known, so it is generally not possible to directly perform a back trace. According to the disclosed technology, however, an error function (for example, the exemplary error function described above) can be used to determine a list of candidate fault locations.

The following discussion illustrates one exemplary manner in which the error function can be used. Consider again the circuits in FIGS. 16, 17 and 18. Assume that for some failing pattern, failures are observed in MISR bits one and two (corresponding to MISR bits 1864, 1866, respectively, in FIG. 18). Using the exemplary notation introduced above, the error functions for MISR bits one and two are:

$$\epsilon_1 = e_{02} + e_{20} + e_{31}$$

$$\epsilon_2 = e_{01} + e_{12} + e_{10} + e_{21} + e_{32}$$

These equations are obtained by summing the errors bits noted in columns 1874 and 1876, respectively. These error function indicate, for example, that for a failure observed in MISR bit one, the fault location lies in the union of the critical-path back cone of flops $sc_{12}$, $sc_{20}$ and $sc_{31}$. Similarly, the fault locations that can potentially explain the failure in MISR bit two lie in the union of the critical-path back cone of flops $sc_{01}$, $sc_{12}$, $sc_{10}$, $sc_{12}$, and $sc_{32}$.

Using the single-location-at-a-time paradigm, the fault location that explains the observed errors in both of the MISR bits one and two can be determined to be in the intersection of the fault locations found above for the individual failing bits. See, e.g., FIGS. 2 and 3.

Once the initial candidate location list has been determined (for example, using the exemplary procedure described above), fault simulation can be used to determine more exact locations that describe the observed failure. The error function can again be used to map the fault behavior captured in the scan flops to the failing MISR bits. This can be done, for example, by plugging in the values of $e_{ij}$ obtained from fault simulation into the error functions $\epsilon_k(e)$ to get the corresponding failing MISR bits.

Figure 20:
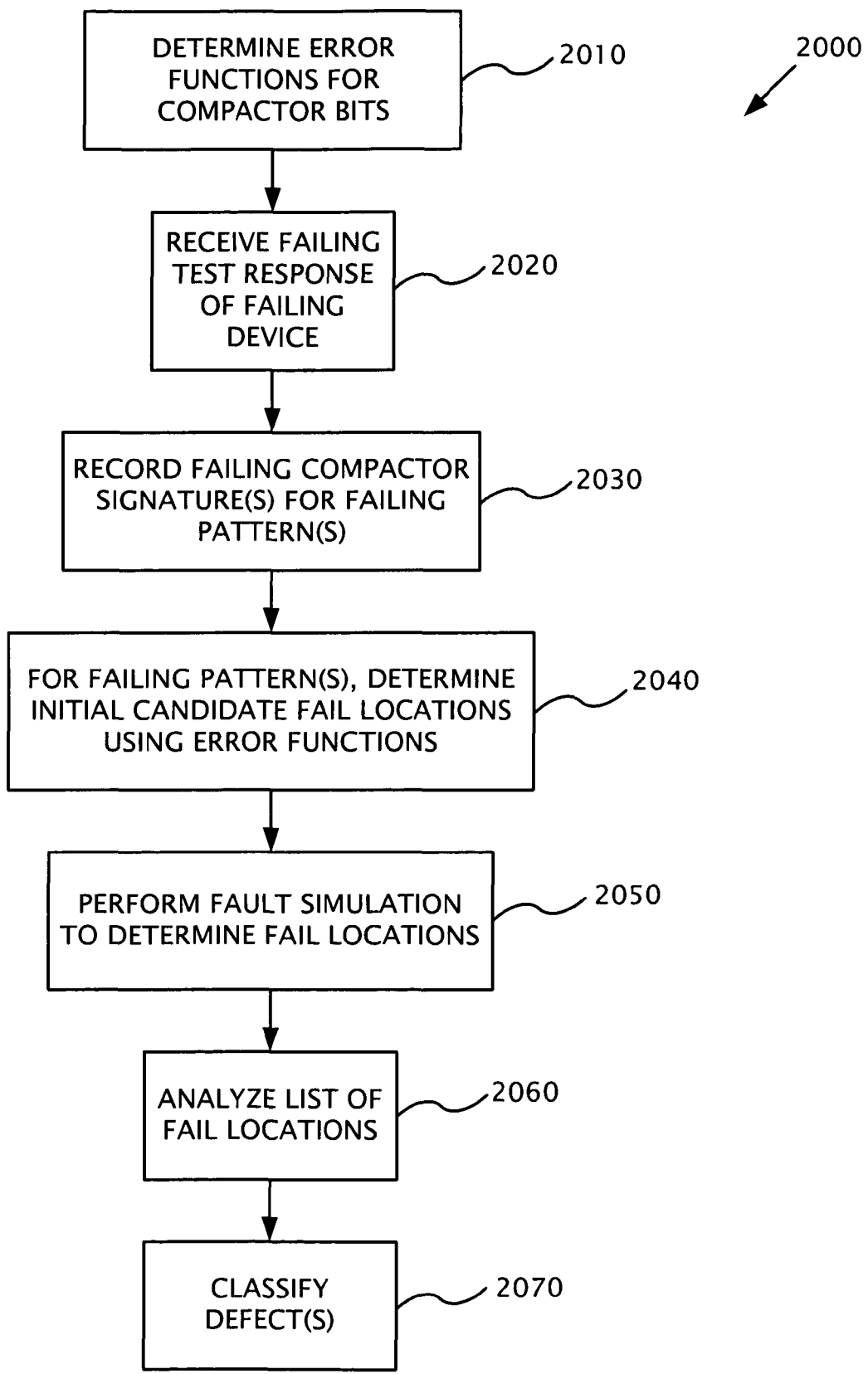
FIG. 20 is a flow chart of an exemplary signature-based diagnosis procedure.

FIG. 20 shows an overall methodology 2000 for applying an exemplary signature-based diagnosis procedure. As part of the procedure, error functions are determined for compactor bits in the design (method act 2010). One or more failing test responses for a failing device are received (method act 2020) and one or more failing compactor signatures are recorded for one or more failing patterns (method act 2030). As explained above, in some embodiments a signature can be generated from a test pattern, the signature can be unloaded from the compactor, and the compactor can be reset or loaded with an expected signature. For one or more of the failing patterns, initial candidate fault locations are determined using the error functions (method act 2040). Fault simulation is performed on this initial list of candidate fault locations to determine the fault locations that can explain the erroneous MISR bits in the failing pattern (method act 2050). (In some embodiments, error functions are also used in this method act.) The list of fault locations determined in method act 2050 is analyzed to identify locations that are the most likely sites of an actual defect in the failing device (method act 2060). These actual fault locations can be classified as a particular type of defect (e.g., bridge, open, or other type) (method act 2070).

In other embodiments, only a subset of the above method acts is performed. In further embodiments, the above method acts are performed individually or in other combinations and subcombinations with one another.

Experimental Results

Experiments were conducted to investigate the effectiveness of an implementation of the disclosed signature-based diagnosis procedure. In general, the experiments involved injecting a small set of stuck-at faults into the logic under test and performing fault diagnosis. To obtain the fault candidates, first fault simulation was performed with 1000 random patterns generated by PRPG. The detected fault list and the random pattern set were stored. About two thousand faults were randomly sampled from the fault list and became the fault candidates. Each fault candidate was injected into the circuit and simulated with the random pattern set. The simulation result was compared with that of a good machine simulation and a failure log was generated. The exemplary diagnostic technique shown in FIG. 20 was performed for each failure log with its corresponding pattern set.

The results obtained using the technique shown in FIG. 20 were compared with results obtained using bypass-mode diagnosis. In bypass mode, the scan cell values were directly shifted out from scan chain outputs and full observability for each scan cell was obtained. The same fault list and pattern set were utilized as in the case of signature-based diagnosis.

A more comprehensive cause-effect analysis could also be used to identify stuck, bridge, open, or transition defects. See, e.g., W. Zou et al., "On Methods to Improve Location Based Logic Diagnosis," *Proc. VLSI Design*, pp. 181-187 (2000)). However, the identification of different defect behaviors is mainly based on the good machine values at fault sites regardless of whether MISRs are used. Therefore, in order to simplify the comparison, only stuck-at-faults were used. "Diagnostic resolution" is chosen as the figure of merit and is defined here as a reciprocal of the number of suspects. For example, if the call out has only one suspect, the resolution is 100%. If the call out has two suspects, the resolution drops to 50%.

TABLE 2

General Information About the Two Industrial Circuits

| Circuit | Number of gates | Scan cells | Scan chains |
|---|---|---|---|
| CKT1 | 1.3 M | 64K | 200 |
| CKT2 | 1.9 M | 128K | 260 |

Two industrial circuits were used for the experiments described herein. General design information related to these two circuits is provided in Table 2. Both designs have over one million gates. It should be noted that in BIST mode, the X sources were bounded to avoid signature corruption. The same X-bounded netlist was used in bypass mode diagnosis.

Table 3 presents the results for signature-based diagnosis as well as for bypass mode diagnosis. In signature-based diagnosis, a 64-bit MISR was used for both circuits. The average diagnosis CPU time is reported as Ave. runtime. The run time was collected on a distributive computing environment. Multiple diagnosis jobs were executed simultaneously on different processors in a grid network of Xeon- and Opteron-based machines. Due to variance of processor speed, the run times collected for the diagnosis procedures are not exactly comparable to each other. Nevertheless, the average run time still provides some indication on how performance is affected by using signature-based diagnosis. Diagnostic resolution is computed for each case and averaged out through all cases in the row Ave. resolution. Total fail pats. represents the total number of failing patterns across all sampled faults.

TABLE 3

Diagnosis Results

| Circuit | CKT1 | | CKT2 | |
|---|---|---|---|---|
| Mode | signature | bypass | signature | bypass |
| Faults | 2000 | 2000 | 2088 | 2088 |
| Ave. runtime | 84.9 s | 30.4 s | 71.0 s | 37.5 s |
| Total Fail pats. | 20577 | 20581 | 23162 | 23162 |
| Ave. resolution | 73.6% | 75.8% | 80.7% | 83.1% |

For the experiments reported in Table 3, the faults injected were correctly diagnosed as the top candidate in suspects list. On average, the resolution with signature-based diagnosis decreases by about 2-3% compared to that with bypass mode diagnosis, and the average run time per fault diagnosis increases about 2 to 3 times. Considering the simplified flow of signature-based diagnosis, the decrease in performance and resolution is very moderate.

Figure 21:
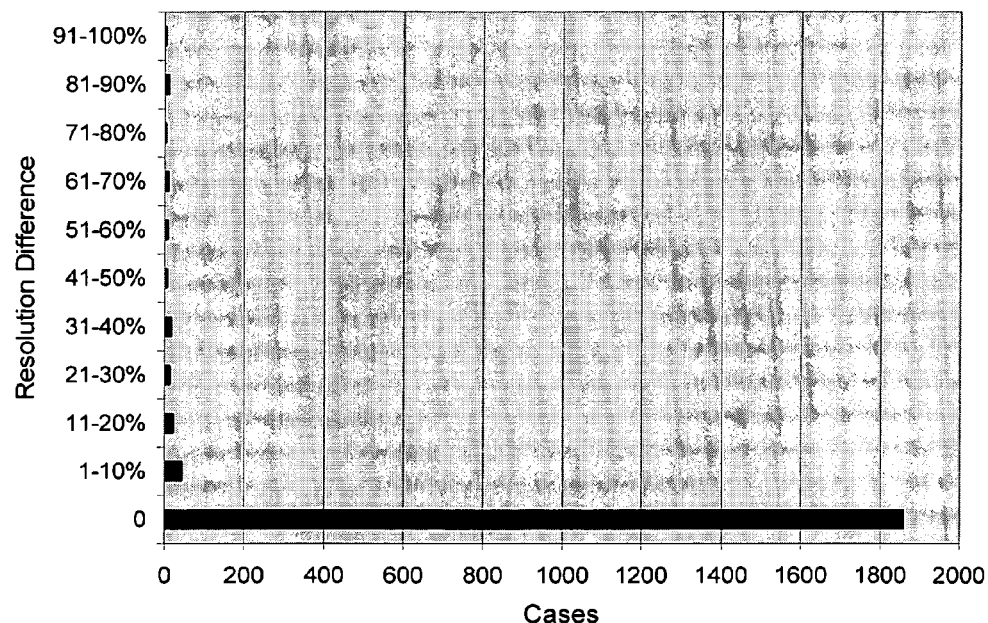
FIG. 21 is a histogram of resolution difference for diagnosis cases for one exemplary circuit.
Figure 22:
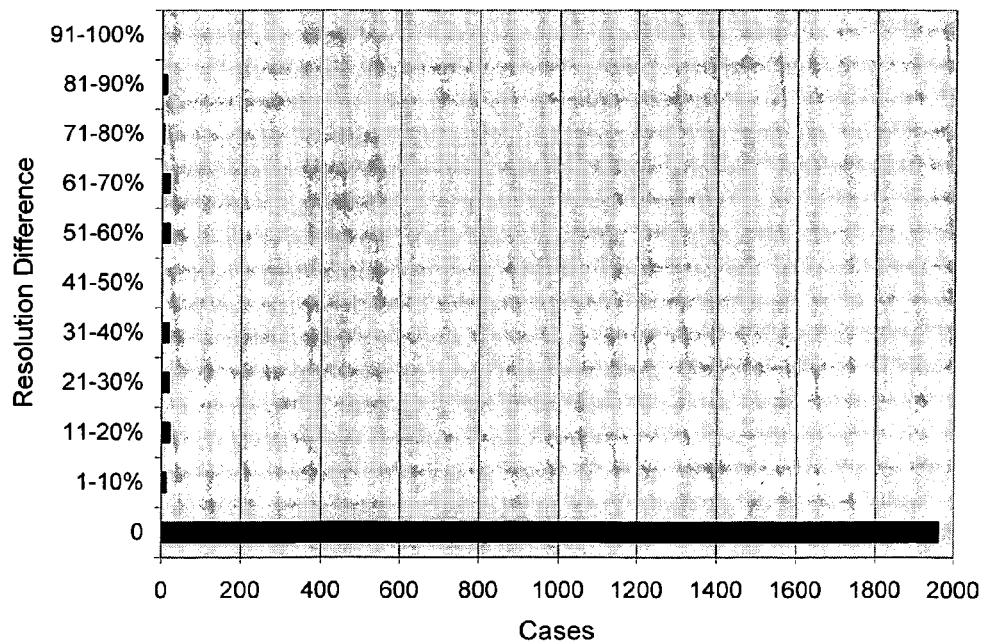
FIG. 22 is a histogram of resolution difference for diagnosis cases for one exemplary circuit.

Of note is that for all the sampled faults, the total number of failing patterns for each diagnosis scheme is close. This indicates that the aliasing probability of a MISR in such schemes is very low. In FIGS. 21 and 22, the histograms of resolution difference are plotted for all the diagnosis cases in CKT1 and CKT2. For each diagnosis case, the resolution difference is computed as the resolution with bypass mode diagnosis subtracted by the resolution with signature-based diagnosis. In the plots, axis Y denotes the range of resolution difference; axis X is the number of cases whose resolution difference falls into corresponding range. For the majority of cases, the diagnosis resolution is the same for both methods. But for a few of them, the resolution of signature-based diagnosis may decrease up to 90%. This is understandable due to the fact some information is lost with MISR compaction.

In Table 4, the impact of MISR size is investigated on CKT1. Eight different MISR sizes were investigated. For the experiments, a simple design using a space compactor was used. For example, consider a BIST implementation with 8 scan chains and a 2-bit MISR. In this case, the space compactor is constructed such that scan chain outputs {2n+i} are XORed together and connected to MISR bit i. That is, chains 1, 3, 5, 7 are XORed together and fed into MISR bit 1. Chains 2, 4, 6, 8 are XORed and connected to MISR bit 2. Whenever a MISR with a different size is implemented, the space compactor can be adjusted according to the rule described above. For the impact of MISR size, four metrics are compared in this example. The first one is the total number of failing patterns across all diagnostic cases. The second one is the average resolution. The third one is the average number of terms in an error function. The last metric is the average run time per diagnostic case. For comparison, the corresponding results for bypass mode diagnosis are also listed. The difference in resolution can be considered marginal. In fact, a 32 or 64-bit MISR can serve relatively well for million-gate designs. On the other hand, the average number of terms of the error function tends to decrease with increasing MISR size. This is mainly due to the fact that fewer error bits are mapped to each MISR bit with increasing MISR size. As is shown, a large number of terms in the error function does not have much impact on diagnostic performance, as is shown by average run time. The variance in the run time is mainly caused by uncertainty in the distributive computing environment used to generate these particular results.

TABLE 4

Impact of MISR Size (on CKT1)

| MISR size | Total Failing Patterns | Average Resolution | Average Terms in Error Function | Average Run Time |
|---|---|---|---|---|
| 16 | 20577 | 73.3% | 33298 | 81.4 s |
| 32 | 20577 | 73.5% | 25983 | 66.5 s |
| 48 | 20577 | 73.5% | 26159 | 86.1 s |
| 64 | 20577 | 73.6% | 19769 | 84.9 s |
| 80 | 20577 | 73.7% | 15784 | 107.7 s |
| 96 | 20577 | 73.7% | 15048 | 124.3 s |
| 112 | 20577 | 73.6% | 8449 | 67.0 s |
| 128 | 20577 | 73.6% | 6848 | 67.3 s |
| bypass | 20581 | 75.8% | n/a | 30.4 s |

The experimental results show that it is possible to perform diagnostics directly from failing MISR signatures. Further, some of the disclosed embodiments use only two statically generated vector sets (e.g., a single MISR unload during a first phase, and MISR unload/reload for each pattern during a second phase). This can greatly simplify the Logic BIST diagnostics flow by eliminating the need to generate and apply DUT specific test vectors. Further, the results show that this can be accomplished with a minimal impact on diagnosis resolution. The impact on tester runtime is also minimal because the per-pattern MISR unload/reload vectors are only applied to failing devices as identified during the first phase. Moreover, the data volume is manageable (e.g., 32K pseudo-random patterns with a 64-bit MISR, which requires slightly over 2M bits of data).

Exemplary Computer Networks

Figure 23:
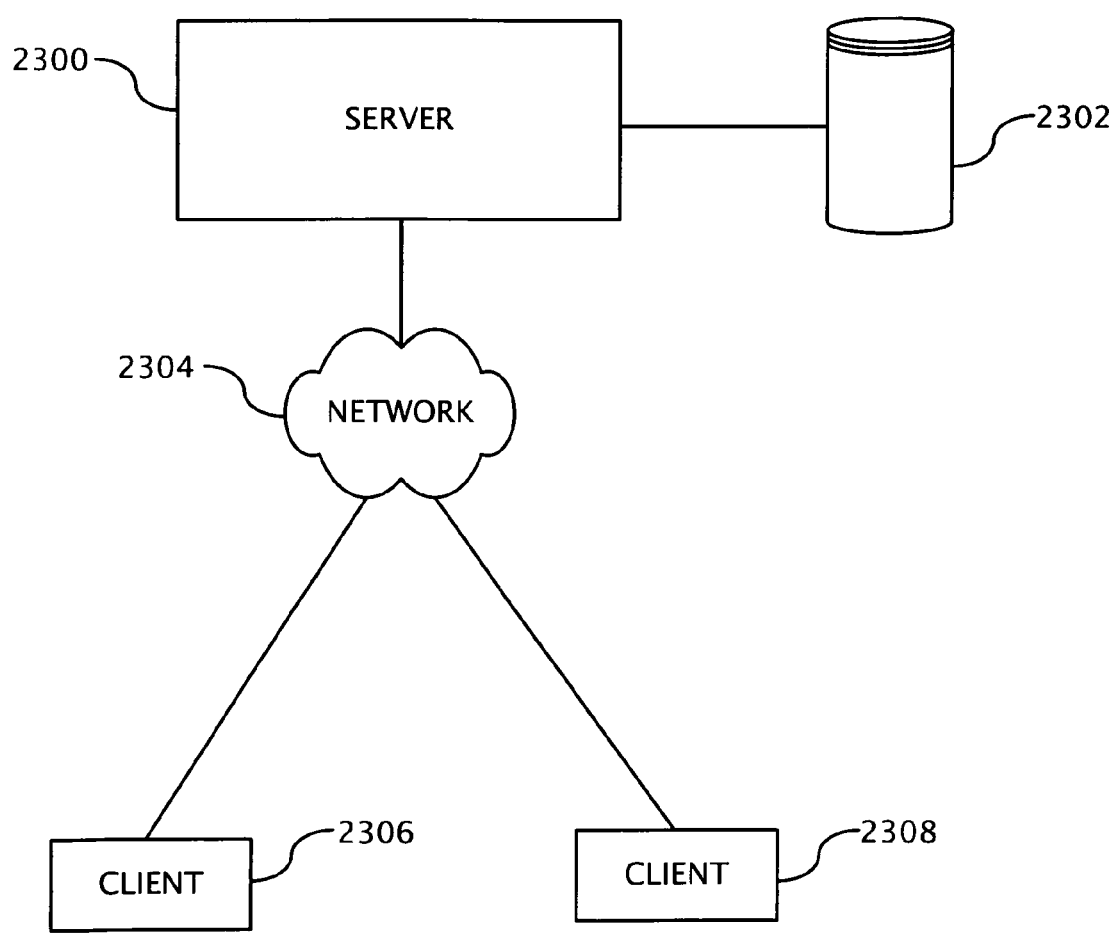
FIG. 23 is a schematic block diagram showing an exemplary distributed computing environment as might be used to implement the disclosed technology.

Any of the aspects of the technologies described above can be performed using a distributed computer network. FIG. 23 shows one such exemplary network. A server computer 2300 can have an associated storage device 2302 (internal or external to the server computer). For example, the server computer 2300 can be configured to perform a chain diagnosis technique according to any of the disclosed embodiments (e.g., as part of an EDA software tool, such as an embedded deterministic testing ("EDT") or ATPG tool). The server computer 2300 may be coupled to a network, shown generally at 2304, which can comprise, for example, a wide-area network, a local-area network, a client-server network, the Internet, or other such network. One or more client computers, such as those shown at 2306, 2308, may be coupled to the network 2304 using a network protocol.

Figure 24:
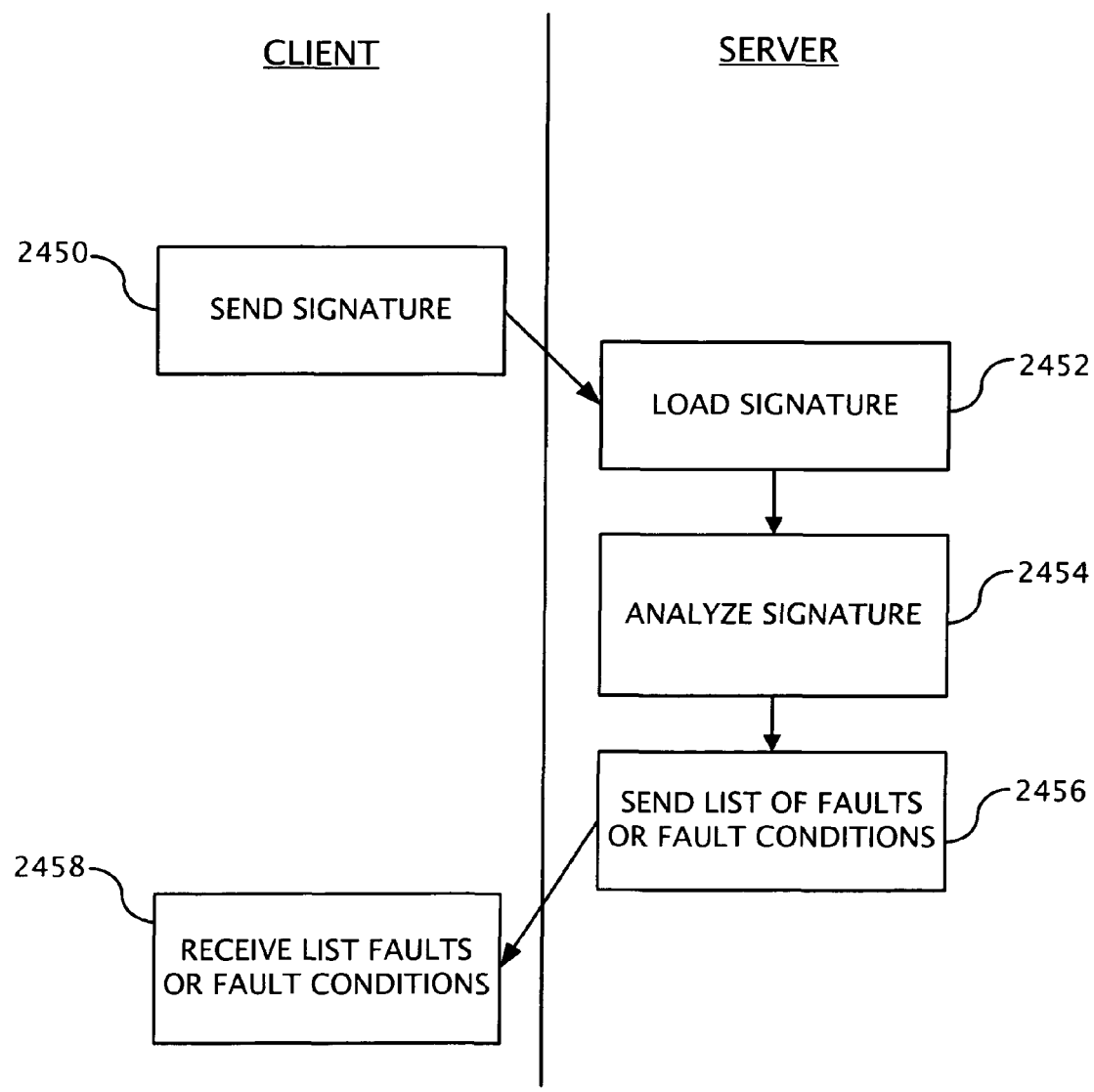
FIG. 24 is a block diagram showing an exemplary manner in which fault diagnosis can be performed in the distributed computing environment illustrated in FIG. 23.

FIG. 24 shows one exemplary manner in which the distributed network shown in FIG. 23 may operate to diagnose faults using a signature. In particular, a signature containing information concerning observed faults from a scan test from a circuit-under-test may be analyzed according to any of the embodiments disclosed herein using a remote server computer, such as the server computer 2300 shown in FIG. 23. In method act 2450, for example, the client computer sends a signature with failing signature bits (obtained from ATE on a production floor, for example). In method act 2452, the signature is received and loaded by the server computer. In method act 2454, the signature is analyzed using a diagnostic procedure according to any of the disclosed embodiments. A list of faults or fault conditions identified by the diagnostic procedure can be created. The list of faults or fault conditions can be stored as one or more separate files or data structures. In method act 2456, the server computer sends the list of faults or fault conditions to the client computer, which receives the diagnostic results in method act 2458. Note that this procedure can occur as the list of faults or fault conditions is being created or very shortly after the list of faults or fault conditions is created (while the circuit-under-test is still coupled to the tester, for example). Thus, the diagnostic procedure can be performed on-line.

It should be apparent to those skilled in the art that the example shown in FIG. 24 is not the only way to perform diagnostics according to the disclosed technology. For instance, the failure log to be analyzed may be stored on a computer-readable medium that is not on a network and that is sent separately to the server (e.g., on a CD-ROM or other computer-readable medium). Moreover, the server computer may perform only a portion of the diagnostic procedure.

Having illustrated and described the principles of the illustrated embodiments, it will be apparent to those skilled in the art that the embodiments can be modified in arrangement and detail without departing from such principles. For example, any of the embodiments described herein can be performed by the tester itself, or by hardware embedded by the CUT, and need not be performed over a distributed computer network. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

We claim:

1. A method of testing an electronic circuit comprising:
receiving a signature from a time compactor associated with the electronic circuit;
determining a list of initial candidate fault locations using one or more error functions associated with the time compactor, the candidate fault locations corresponding to logic instances in the electronic circuit, the error functions being indicative of scan cells in the electronic circuit that at least partially contribute to the value of one or more failing compactor bits in the signature, the one or more error functions having been determined at least in part by simulating an unloading of error values from the scan cells in the electronic circuit into the time compactor; and
storing the list of initial candidate fault locations on one or more computer readable media.

2. The method of claim 1, further comprising performing one or more fault simulations to determine a revised list of candidate fault locations from the list of initial candidate fault locations.

3. The method of claim 2, in which the error functions are used as part of the fault simulations.

4. The method of claim 1, in which the time compactor has inputs coupled to a space compactor.

5. The method of claim 1, in which the simulation comprises, for a selected scan chain, simulating an unloading of an error value from a later-unloaded scan cell as part of simulating an unloading of an error value from an earlier-unloaded scan cell.

6. The method of claim 1, in which the signature corresponds to the electronic circuit's response to a single test pattern.

7. The method of claim 1, in which the time compactor is a multiple input signature register.

8. The method of claim 1, in which the act of determining a list of initial candidate fault locations comprises applying a path tracing technique.

9. The method of claim 8, in which the path tracing technique comprises identifying one or more candidate fault locations in an intersection between logic cones of scan cells identified by the error function.

10. A circuit having a repaired fault that was identified using a method, the method comprising:
receiving a signature from a time compactor associated with an electronic circuit;
determining a list of initial candidate fault locations using one or more error functions associated with the time compactor, the candidate fault locations corresponding to logic instances in the electronic circuit, the error functions being indicative of scan cells in the electronic circuit that at least partially contribute to the value of one or more failing compactor bits in the signature, the one or more error functions having been determined at least in part by simulating an unloading of error values from the scan cells in the electronic circuit into the time compactor;
storing the list of initial candidate fault locations on one or more computer readable media; and
performing one or more fault simulations to determine a revised list of fault locations from the list of initial candidate fault locations.

11. One or more computer-readable memory or storage devices storing computer-executable instructions for causing a computer to perform a method of testing an electronic circuit, the method comprising:
receiving a signature from a time compactor associated with an electronic circuit;
determining a list of initial candidate fault locations using one or more error functions associated with the time compactor, the candidate fault locations corresponding to logic instances in the electronic circuit, the error functions being indicative of scan cells in the electronic circuit that at least partially contribute to the value of one or more failing compactor bits in the signature, the one or more error functions having been determined at least in part by simulating an unloading of error values from the scan cells in the electronic circuit into the time compactor; and
storing the list of initial candidate fault locations.

12. The one or more computer-readable memory or storage devices of claim 11, in which the method further comprises performing one or more fault simulations to determine a revised list of fault locations from the list of initial candidate fault locations.

13. The one or more computer-readable memory or storage devices of claim 12, in which the error functions are used as part of the fault simulations.

14. The one or more computer-readable memory or storage devices of claim 11, in which the time compactor has inputs coupled to a space compactor.

15. The one or more computer-readable memory or storage devices of claim 11, in which the simulation comprises, for a selected scan chain, simulating an unloading of an error value from a later-unloaded scan cell as part of simulating an unloading of an error value from an earlier-unloaded scan cell.

16. The one or more computer-readable memory or storage devices of claim 11, in which the signature corresponds to the electronic circuit's response to a single test pattern.

17. The one or more computer-readable memory or storage devices of claim 11, in which the time compactor is a multiple input signature register.

18. The one or more computer-readable memory or storage devices of claim 11, in which the act of determining a list of initial candidate fault locations comprises applying a path tracing technique.

19. The one or more computer-readable memory or storage devices of claim 18, in which the path tracing technique comprises identifying one or more candidate fault locations in an intersection between logic cones of scan cells identified by the error function.

20. One or more computer-readable memory or storage devices storing a list of candidate fault locations, the list of candidate fault locations having been produced according to a method comprising:
receiving a signature from a time compactor associated with an electronic circuit; and
determining a list of initial candidate fault locations using one or more error functions associated with the time compactor, the candidate fault locations corresponding to logic instances in the electronic circuit, the error functions being indicative of scan cells in the electronic circuit that at least partially contribute to the value of one or more failing compactor bits in the signature, the one or more error functions having been determined at least in part by simulating an unloading of error values from the scan cells in the electronic circuit into the time compactor.

21. A system for testing an electronic circuit comprising:
means for receiving a signature from a time compactor associated with an electronic circuit;

means for determining a list of initial candidate fault locations using one or more error functions associated with the time compactor, the candidate fault locations corresponding to logic instances in the electronic circuit, the error functions being indicative of scan cells in the electronic circuit that at least partially contribute to the value of one or more failing compactor bits in the signature, the one or more error functions having been determined at least in part by simulating an unloading of error values from the scan cells in the electronic circuit into the time compactor; and means for storing the list of initial candidate fault locations on one or more computer readable media.

22. A method, comprising:

determining one or more error signatures, the one or more error signatures describing the effects of one or more error values captured in one or more scan cells in one or more scan chains of an integrated circuit design on a compactor signature produced by a compactor coupled to the one or more scan chains, the compactor signature comprising a plurality of compactor bits, and the determining the one or more error signatures comprising simulating an unloading of the one or more error values from the one or more scan cells into the compactor;

producing an error function for a selected compactor bit from one or more of the determined error signatures, the error function describing the effect of one or more of the scan cells on the value of the selected compactor bit;

storing the error function on one or more computer-readable media;

receiving a failing signature generated from an implementation of the compactor, the failing signature including a failing value at the selected compactor bit; and determining a list of initial circuit defect candidate locations based at least in part on the error function and using a path-tracing technique.

23. The method of claim 22, in which the act of simulating comprises:

simulating storing an error value in a first scan cell; and
simulating storing a non-error value in one or more remaining scan cells.

24. The method of claim 23, in which the error value is one and the non-error value is zero.

25. The method of claim 22, in which the act of simulating comprises simulating an unloading of a first value as part of simulating an unloading of a second value.

26. The method of claim 22, further comprising performing one or more fault simulations according to the list of initial circuit defect candidate locations.

27. The method of claim 22, in which the path-tracing technique comprises identifying candidate fault locations within the intersection of logic cones for scan cells identified by the error function.

28. The method of claim 22, in which the compactor is a multiple input signature register.

29. The method of claim 22, in which the compactor is an infinite response register.

30. The method of claim 22, in which the compactor is a time compactor.

31. The method of claim 30, in which the time compactor is coupled to one or more scan chain outputs via a space compactor.

32. One or more computer-readable memory or storage devices storing computer-executable instructions for causing a computer to perform a method, the method comprising:

determining one or more error signatures, the one or more error signatures describing the effects of one or more error values captured in one or more scan cells in one or more scan chains of an integrated circuit design on a compactor signature produced by a compactor coupled to the one or more scan chains, the compactor signature comprising a plurality of compactor bits, the determining the one or more error signatures comprising simulating an unloading of the one or more error values from the one or more scan cells into the compactor;

producing an error function for a selected compactor bit from one or more of the determined error signatures, the error function describing the effect of one or more of the scan cells on the value of the selected compactor bit;

storing the error function;

receiving a failing signature generated from an implementation of the compactor, the failing signature including a failing value at the selected compactor bit; and determining a list of initial circuit defect candidate locations based at least in part on the error function and using a path-tracing technique.

33. The one or more computer-readable memory or storage devices of claim 32, in which the act of simulating comprises:

simulating storing an error value in a first scan cell; and
simulating storing a non-error value in one or more remaining scan cells.

34. The one or more computer-readable memory or storage devices of claim 33, in which the error value is one and the non-error value is zero.

35. The one or more computer-readable memory or storage devices of claim 32, in which the act of simulating comprises simulating an unloading of a first value as part of simulating an unloading of a second value.

36. The one or more computer-readable memory or storage devices of claim 32, the method further comprising performing one or more fault simulations according to the list of initial circuit defect candidate locations.

37. The one or more computer-readable memory or storage devices of claim 32, in which the path-tracing technique comprises identifying candidate fault locations within the intersection of logic cones for scan cells identified by the error function.

38. The one or more computer-readable memory or storage devices of claim 32, in which the compactor is a multiple input signature register.

39. The one or more computer-readable memory or storage devices of claim 32, in which the compactor is an infinite response register.

40. The one or more computer-readable memory or storage devices of claim 32, in which the compactor is a time compactor.

41. The one or more computer-readable memory or storage devices of claim 40, in which the time compactor is coupled to one or more scan chain outputs via a space compactor.

42. A method of testing an electronic circuit, the method comprising:

using a time compactor to generate a signature from test results stored in a plurality of scan chains in the electronic circuit, the test results being generated after application of a test pattern;

identifying scan cells that possibly captured error values caused by one or more faulty logic instances in the electronic circuit as a result of the application of the test pattern using a description of an association between scan cells in the circuit and signature bits in the signature generated by the compactor, the description being determined at least in part by simulating an unloading of a value representing an error captured by one of the scan cells into the time compactor; and storing a list of the scan cells identified.

43. The method of claim 42, further comprising performing path-tracing into logic cones associated with the scan cells identified to determine initial candidate fault locations; and storing a list of the initial candidate fault locations.

44. The method of claim 43, in which the list of initial candidate fault location consists of one or more fault locations in an intersection of the logic cones.

45. The method of claim 42, in which the simulation includes, for a selected scan chain, simulating an unloading of an error value from a later-unloaded scan cell as part of simulating an unloading of an error value from an earlier-unloaded scan cell.

* * * * *